(12) United States Patent
Matsudera et al.

(10) Patent No.: US 6,801,144 B2
(45) Date of Patent: Oct. 5, 2004

(54) SEMICONDUCTOR MEMORY DEVICE INPUTTING/OUTPUTTING DATA SYNCHRONOUSLY WITH CLOCK SIGNAL

(75) Inventors: Katsuki Matsudera, Kawasaki (JP); Masaru Koyanagi, Yokohama (JP); Kazuhide Yoneya, Sagamihara (JP); Toshiki Hisada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/678,742

(22) Filed: Oct. 2, 2003

(65) Prior Publication Data

US 2004/0114453 A1 Jun. 17, 2004

(30) Foreign Application Priority Data

Oct. 4, 2002 (JP) ......................................... 2002-292408

(51) Int. Cl.[7] .............................................. H03M 9/00
(52) U.S. Cl. ...................................... 341/100; 341/101
(58) Field of Search ................................ 341/100, 101

(56) References Cited

U.S. PATENT DOCUMENTS 6,259,387 B1 * 7/2001 Fukazawa ................... 341/100

FOREIGN PATENT DOCUMENTS

| JP | 2000-188381 | 7/2000 |
|---|---|---|
| JP | 2002-108690 | 4/2002 |
| JP | 2002-109886 | 4/2002 |

* cited by examiner

Primary Examiner—Brian Young
(74) Attorney, Agent, or Firm—Hogan & Hartson, LLP

(57) ABSTRACT

An input/output circuit inputs/outputs serial data. A register section comprises a first and a second register. The first register converts the serial data into parallel data. The second register converts parallel data into serial data. A first control signals supply a conversion timing for each bit when the serial data are converted into the parallel data. A second control signals supply a conversion timing for each bit when the parallel data are converted into the serial data. The signal generating circuit controls a timing of rise or fall of the first control signals and sets which of the memory cells should store a value for each bit, of the serial data, and controls a timing of rise or fall of the second control signals and sets which number of value of the serial data should be the value for each bit, of the parallel data read from the memory cells.

15 Claims, 25 Drawing Sheets

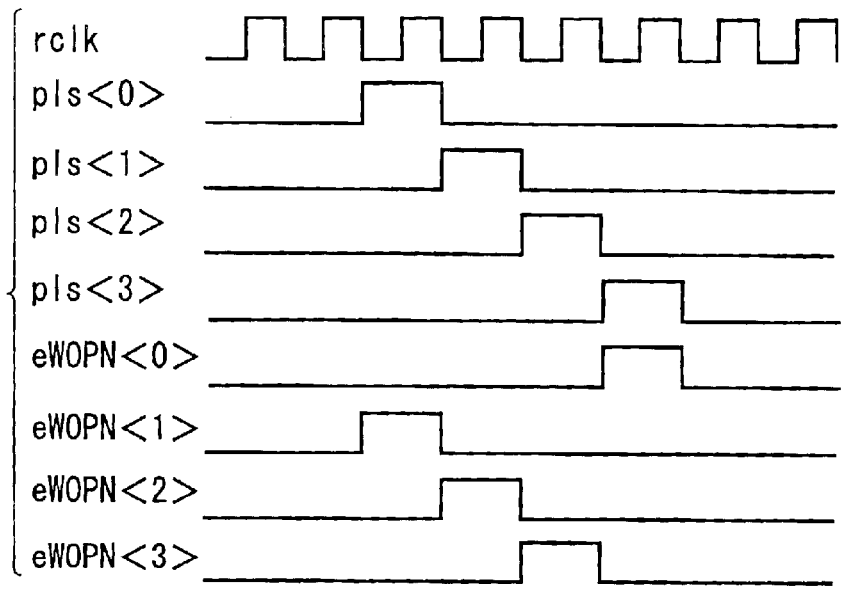
FIG. 28B
FIG. 28A
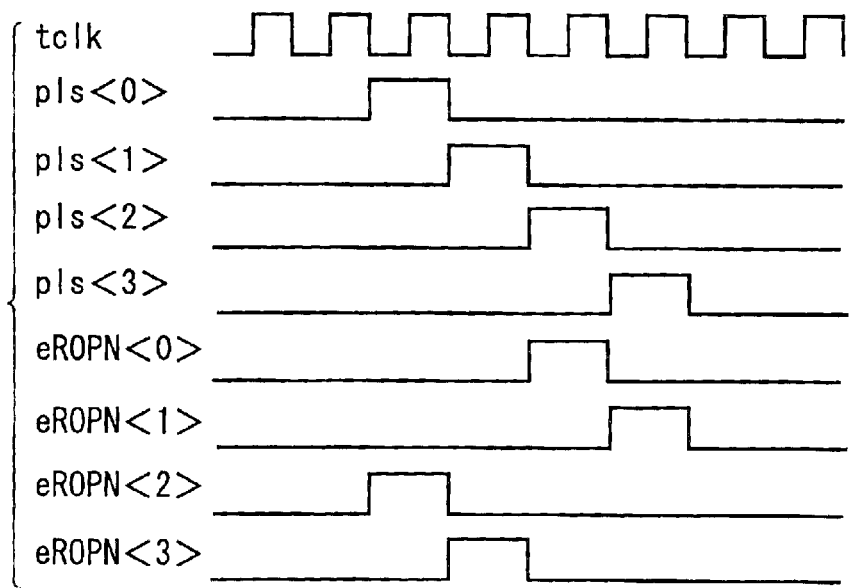
FIG. 29B
FIG. 29A

SEMICONDUCTOR MEMORY DEVICE INPUTTING/OUTPUTTING DATA SYNCHRONOUSLY WITH CLOCK SIGNAL

CROSS-REFERENCE TO RELATED APPLICATIONS

This application is based upon and claims the benefit of priority from the prior Japanese Patent Application No. 2002-292408, filed Oct. 4, 2002, the entire contents of which are incorporated herein by reference.

BACKGROUND OF THE INVENTION

1. Field of the Invention

This invention relates to a semiconductor memory device inputting/outputting data synchronously with a high-frequency clock signal.

2. Description of the Related Art

A circuit configuration of a general high-frequency clock signal synchronizing memory is shown in FIG. 1. A memory circuit 1 is roughly composed of a memory core section 2 and other I/F circuits.

The I/F circuits include right and left shift register sections 3 adjacent to the memory core section 2, right and left I/O circuits (input/output circuits) 4 arranged between external signal lines corresponding to the shift register sections 3 and the shift register sections 3, a DLL (Delayed Locked Loop) circuit 5, and a control logic 6.

The DLL circuit 5 generates a clock signal rclk controlling internal write data, synchronously with a write clock signal RXCLK which is input from outside, and also generates a clock signal tclk controlling internal read data, synchronously with a read clock signal TXCLK which is input from outside.

The control logic 6 performs a logic operation of a protocol which is input by an external command signal COMMAND and generates a control signal of the memory circuit 1.

The right and left I/O circuits 4 input serial write data DQ<8:15> and DQ<0:7> from external input/output data lines, respectively, and output internal serial write data eWrite and oWrite that are input to the right and left shift register sections 3 comprising a plurality of shift registers, by using the internal write data control clock signal rclk.

In addition, the right and left I/O circuits 4 input internal serial read data eRead and oRead from the right and left shift register sections 3, and output the serial read data DQ<8:15> and DQ<0:7> to the external input/output data lines, respectively, by using the internal read data control clock signal tclk.

<0:7> and <8:15> represent front 8-bit data and rear 8-bit data of totally 16-bit data, respectively. Letters "e" and "o" attached to Read and Write represent data of even numbers and data of odd numbers, respectively.

Each of the right and left shift register sections 3 inputs internal parallel read data RD<0:7> which is read from the memory core section 2 by the control signal during the read operation, and outputs internal parallel write data WD<0:7> by the control signal and writes the data to the memory core section 2 during the write operation.

Thus, the right and left shift register sections 3, arranged between the right and left I/O circuits 4 and the memory core section 2, convert the internal parallel read data RD<0:7> into the internal serial read data eRead and oRead during the read operation, and convert the internal serial write data eWrite and oWrite into the internal parallel write data WD<0:7> during the write operation.

The memory core section 2 is composed of a general DRAM circuit that consists of a row decoder, a column decoder, a memory cell array, a sense amplifier, a redundancy fuse and a DQ buffer.

FIG. 2 shows a path in which the parallel read data which is read from the memory core section 2 is converted into the serial read data, which reaches the I/O circuit 4, in the layout of the conventional high-frequency clock signal synchronizing memory as described above.

The right and left I/O circuits 4 included in a peripheral circuit section 7 surrounded by a dotted line are divided into IO_0, IO_1, ... IO_7 and IO_8, IO_9, ... IO_15, which are arranged on the right and left sides. Letters "_U" and "_B" attached to the serial read data eRead and oRead represent data which is read from the upper memory core sections 2 to the peripheral circuit section 7 and data which is read from the lower memory core sections 2 to the peripheral circuit section 7, respectively. As the read data is read from either the upper memory core sections 2 or the lower memory core sections 2 in accordance with the address to which an access is made, the shift register section 3 outputs the serial read data eRead or oRead corresponding to the memory core section 2 to which an access is made.

When the data is written to the memory core sections 2, the serial write data is input from the I/O circuits 4 to the shift register sections 3. The shift register sections 3 convert the serial write data into the parallel write data, which is written to the memory core sections 2.

Thus, as the data flow in the write operations can be obtained by reversing the data flow in the read operations, the path of the read data in the read operations is exemplified in FIG. 2.

In the memory core sections 2 arranged on the upper and lower sides of the peripheral circuit section 7, as shown in FIG. 2, 8-bit cell regions C0 to C7 are assigned to the left memory core sections 2 to correspond to the 8-bit IO_0 to IO_7 of the I/O circuit 4, respectively. Similarly, 8-bit cell regions C8 to C15 are assigned to the memory core sections 2 of the right side to correspond to the 8-bit IO_8 to IO_15, respectively. The high-frequency clock synchronizing memory is configured to have the input/output width of entirely 16 bits.

Thus, as shown in the memory core sections 2 of FIG. 2, the 8-bit regions C0 to C15 corresponding to the sequence of input/output to IO_0<0:7> to IO_15<0:7> are assigned to the memory cell arrays, respectively.

In active operations of the high-frequency clock signal synchronizing memory, two of the four memory core sections are selected, i.e., either a combination of the upper left and lower right memory core sections or a combination of the lower left and upper right memory core sections is selected, in accordance with the address signal.

The read data which is read in parallel for every 8 bits, from the memory core sections 2 to IO_0 to IO_15, is converted into the 8-bit serial read data in the shift register sections 3.

FIG. 3A shows a configuration of the shift register section 3. In the shift register section 3, shift registers are arranged to correspond to the respective IO circuits IO_0 to IO_15 serving as the I/O circuit 4. Each of the shift registers is configured to comprise write registers for the write operation and read registers for the read operation as shown in FIG. 3B.

The write registers include write registers for even numbers which input the 4-bit serial write data eWrite corresponding to the data input to each IO at the time of even numbers and which output the 4-bit parallel write data WD <0, 2, 4, 6>, and write registers for odd numbers which input the 4-bit serial write data oWrite corresponding to the data input to at the time of odd numbers and which output the 4-bit parallel write data WD <1, 3, 5, 7>.

The read registers include read registers for even numbers which input the 4-bit parallel read data RD <0, 2, 4, 6> corresponding to the data output from each IO at the time of even numbers and which output the 4-bit serial read data eRead, and read registers for odd numbers which input the 4-bit parallel read data RD <1, 3, 5, 7> corresponding to the data output at times of odd numbers and which output the 4-bit serial read data oRead.

Specifically, the write registers and the read registers are operated synchronously with both edges of rise and fall of the write control clock signal rclk and the read control clock signal tclk, and perform 8-bit data transfer at a 4-cycle clock.

An example of the write operation and the read operation in the high-frequency clock signal synchronizing memory will be explained by using timing waveform charts shown in FIG. 4 to FIG. 7, in view of one of the memory core sections 2 shown in FIG. 2, corresponding shift registers and corresponding one of the I/O circuits.

First, the read operation will be explained by using FIG. 4. When the read command (Read Command) to instruct the read operation is input in accordance with the external command signal COMMAND, the 8-bit parallel read data RD <0:7> is output from one of the memory core sections 2 after a certain period of time.

The 8-bit parallel read data RD <0:7> is converted into the 4-bit serial data eRead including even numbers 0, 2, 4 and 6, synchronously with the fall of the clock signal tclk that controls the internal read data, by the read registers for even numbers included in the shift register shown in FIG. 3B.

In addition, the parallel read data RD <0:7> is converted into the 4-bit serial data oRead including odd numbers 1, 3, 5 and 7, synchronously with the rise of the clock signal tclk, by the read registers for odd numbers included in the corresponding shift register.

By synthesizing them, the 8-bit serial read data numbered 0 to 7 is output outside via the corresponding I/O circuit. Thus, the 8-bit serial read data is output at the 4-cycle clock signal tclk. In the above-described read operation, the 4-bit serial read data eRead and the 4-bit serial read data oRead can be alternately output by using the rise edge and the fall edge of the clock signal tclk.

Next, another example of the read operation will be explained by using FIG. 5.

FIG. 5 is a timing waveform chart in a case of converting the parallel data into the serial data (hereinafter parallel/serial conversion) by using the only rise edge of the clock signal tclk that controls the internal read data.

An 8-cycle clock signal tclk is needed for 8-bit parallel/serial conversion, as compared with the case of using the rise edge and the fall edge of the clock signal tclk as explained in FIG. 4.

Next, an example of the write operation will be explained by using FIG. 6.

When the write command signal (Write Command) to instruct the write operation is input in accordance with the external command signal COMMAND, the serial write data DQ <0:7> is input to the external signal after a certain period of time. The data is input to the I/O circuit, which outputs the 8-bit serial write data.

The 8-bit serial write data as output from the I/O circuit is converted into the 4-bit serial write data eWrite including even numbers 0, 2, 4 and 6, synchronously with the rise of the clock signal rclk that controls the internal write data, on the even number side of the write registers included in the corresponding shift register of FIG. 3B, and the write data is maintained.

In addition, the serial write data DQ <0:7> is converted into the 4-bit serial write data oWrite including odd numbers 1, 3, 5 and 7, synchronously with the fall of the clock signal rclk, on the odd number side of the write registers included in the corresponding shift register of FIG. 3B, and the write data is maintained.

By synthesizing outputs of respective flip-flops (FF) on the even number side and the odd number side, included in the write registers of FIG. 3B which maintain the serial write data of even numbers and odd numbers, conversion of the serial data into the parallel data (hereinafter serial/parallel conversion) is performed and the parallel and write data WD <0:7> numbered 0 to 7 is output.

Next, another example of the write operation will be explained by using FIG. 7.

FIG. 7 is a timing waveform chart in a case of performing the serial/parallel conversion by using the only rise edge of the clock signal rclk which controls the internal write data. The 8-cycle clock signal rclk is needed to perform the 8-bit serial/parallel conversion, as compared with the case of using the rise edge and the fall edge of the clock signal rclk as explained in FIG. 6.

Next, a configuration of the conventional high-frequency clock signal synchronizing memory will be explained by using FIGS. 8A and 8B.

A pad (not shown) to be connected to input and output pins is arranged at a central section of a chip. The I/O circuits 4 are aligned on the right and left sides of the DLL circuit 5 and the control logic 6 is provided adjacent to top portions of the circuits, as shown in FIG. 8A. The shift register sections 3 are arranged on the top of the control logic 6 and on the bottom of the DLL circuit 5 and I/O circuits 4 so as to perform the data transfer with the upper and lower memory core sections 2 as represented by arrows.

A DQ buffer 8 in the memory core section 2, and a redundancy fuse circuit 9 improving a manufacturing yield by assigning redundancy to the memory core section 2 and separating defective bits, are arranged adjacent to the shift register section 3.

Similarly to the general semiconductor memory device, the memory core section 2 comprises the DQ buffer 8, the fuse circuit 9, a memory cell array 21, a sense amplifier 10, a column decoder 11, and a row decoder 12, as shown in FIG. 8B. An address signal ADD is input to the DQ buffer 8, the fuse circuit 9, the memory cell array 21, the column decoder 11, and the row decoder 12. The write data WD is input to the DQ buffer 8. The read data RD is output from the DQ buffer 8.

In the above-explained prior art, the shift register comprises a number of flip-flops (FF), and a plurality of transfer gates are provided in each of the flip-flops. The prior art has a problem that as the clock signal is input to the transfer gates of the flip-flops, an electric current consumed by charging or discharging of the clock signal is increased.

Next, the prior art comprising the shift register sections 3 and the I/O circuits 4 arranged as shown in FIG. 9 will be explained. In this example, each of the memory core sections 2A, 2B and the shift register sections 3 is turned at 90 degrees, and each of the shift register sections 3 is shared by the memory core sections 2 which are arranged parallel to the peripheral circuit section 7, as compared with the example of FIG. 2. The shift registers for even numbers and the shift registers for odd numbers, in the shift register sections 3, are arranged, separately, at right angles with the peripheral circuit section 7 (see, for example, Jpn. Pat. Appln. KOKAI Publication No. 2000-188381).

In the example of FIG. 9, the shift register sections 3 are configured as shown in FIG. 10A and FIG. 10B in order to reduce the length of lines in which the read data eRead and oRead, and the write data eWrite and oWrite flow. FIG. 10B is a schematic view showing a layout of main portions of the prior art shown in FIG. 9. FIG. 10A is a view showing a configuration of the shift registers on the even number side in the shift register section 3, in the layout of FIG. 10B.

In the prior art shown in FIG. 3A, the shift registers are arranged to correspond to the respective IOs while the shift registers on the read side are arranged for each flip-flop corresponding to the sequence of input and output in the prior art of FIG. 9.

In addition, the shift registers (write registers) on the write side are configured as shown in FIG. 11, in order to reduce the length of lines in which the write data eWrite, oWrite flows.

The operations of the write registers on the even number side will be explained by using a timing waveform chart of FIG. 12. A flip-flop F11 delays the serial write data eWrite by 1 clock and outputs the delayed data to a node N4 at every rise of the clock signal rclk. The serial write data is output to the node N4 in the sequence of 0, 2, 4 and 6. A latch circuit 15 inputs the 0-th write data that has been output to the node N4 after a signal WRTLAT becomes "H", then outputs the write data to a node N1, and maintains the write data after the signal WRTLAT becomes "L".

A flip-flop F12 inputs the signal WRTLAT and outputs a signal L1 delayed by 1 clock from the signal WRTLAT. In accordance with the signal L1, a latch circuit LT16 the second signal that has been output to the node N4 to a node N2 and further maintains this, similarly to the latch circuit LT15. A latch circuit LT17 makes the same operation as the latch circuit LT16.

The 0-th data, second data, fourth data and sixth data are input to the nodes N1, N2, N3 and N4, is respectively, and the parallel write data WD <0, 2, 4, 6> is output in accordance with a signal WRTOPEN and maintained, three clocks after the signal WRTLAT becomes "H".

The write register configured as shown in FIG. 11 performs the serial/parallel conversion by the above-explained operation. In this write register, the latch circuits corresponding to each IO whose number corresponds to the number of the I/O circuits are required, but the flip-flops which input the clock signal rclk and transfer the signal WRTLAT can share all of the IOs. For this reason, the number of flip-flops which input the clock signal rclk is reduced as compared with the write register of the prior art shown in FIG. 3B, and the power consumed in the write operation is remarkably reduced.

In the prior art shown in FIG. 9, as described above, the power consumed in the write operation is small, but the power consumed in the read operation is the same as that of the prior art shown in FIG. 2. In addition, the prior art of FIG. 9 has a problem that the operation margin to the high-speed operation is small as the lines of the read data eRead, oRead and the write data eWrite, oWrite and the lines of the node N4 and the like in the write register are long.

Next, prior art having an arrangement of the shift register sections 3 and the I/O circuits 4 as shown in FIG. 13 will be explained. In this example, as compared with the prior art of FIG. 2, the write register employs the same data transfer scheme using the flip-flops, similarly to the prior art of FIG. 3B, and the read register employs the scheme of transferring the control signal, similarly to the write register of the prior art of FIG. 11 (see, for example, Jpn. Pat. Appln. KOKAI Publication No. 2002-109886).

In the example of FIG. 13, in order to reduce the length of the lines of the read data eRead, oRead and the write data eWrite, oWrite, the shift registers are configured as shown in FIG. 14A and FIG. 14B. FIG. 14B is a schematic view showing a layout of the main sections of the prior art shown in FIG. 13 and FIG. 14A is a view showing a configuration of a shift register on an even number side in the shift register section 3 of the layout.

In the prior art shown in FIG. 2, the shift registers are arranged to correspond to the respective IOs while, in the prior art of FIG. 13, the read registers for all of the IOs are arranged for the respective flip-flops corresponding to the sequence of input and output. The sequence of arrangement of the registers is opposite to that in the configuration of FIG. 10A.

The read register is configured as shown in FIG. 15 to reduce the length of the lines of the read data eRead, oRead.

The operation of the read register on the even number side will be explained by using a timing waveform chart of FIG. 16. A latch circuit LT21 outputs 0-th read data to a node N1 while a signal RDLAT is "H". The output is Hiz (high impedance) while the signal RDLAT is "L". A flip-flop (FF) F21 outputs a signal L2 delayed by 1 clock from the signal RDLAT. A latch circuit LT22 outputs second read data to the node N1 while the signal L2 is "H". The output is HiZ while the signal L2 is "L". A flip-flop F22 outputs a signal L3 delayed by 1 clock from the signal L2. A latch circuit LT23 outputs fourth read data to the node N1 while the signal L3 is "H". The output is HiZ while the signal L3 is "L". A flip-flop F23 outputs a signal L4 delayed by 1 clock from the signal L3. A latch circuit LT24 outputs sixth read data to the node N1 while the signal L4 is "H". The output is HiZ while the signal L4 is "L".

According to the above operation, the 0-th data, the second data, the fourth data and the sixth data are output in series to the node N1. The data output to the node N1 is delayed by 1 clock by a flip-flop F24, and the 0-th, second, fourth and sixth read data eRead is output in series.

The read register configured as shown in FIG. 15 performs the parallel/serial conversion by the above-explained operation. This read register requires the latch circuits corresponding to each IO whose number is the same as the number of the I/O circuits, but the flip-flops which transfer the signal RD LAT to which the clock signal tclk is input can share all of the IOs. For this reason, the number of flip-flops which input the clock signal tclk is reduced as compared with the read register of the prior art shown in FIG. 3B, and the power consumed in the read operation is remarkably reduced.

In the prior art shown in FIG. 13, as described above, the power consumed in the read operation is small, but the power consumed in the write operation is the same as that of the prior art shown in FIG. 2. In addition, the prior art of FIG. 13 has a problem that the operation margin to the high-speed operation is small as the lines of the read data eRead, oRead and the write data eWrite, oWrite and the lines of the node N1 and the like in the write register are long.

The problems of the above-described prior art can be summarized as follows.

In the prior art of FIG. 2, the shift register comprises a number of flip-flops (FF). A number of transfer gates are provided at each of the flip-flops. The prior art has a problem that as the clock signal is input to the transfer gates which the flip-flops comprise, the current consumed by charging and discharging of the clock signal becomes increased.

The prior art of FIG. 9 has a problem that the amount of the current consumed in the write operation is small, but the amount of the current consumed in the read operation is large similarly to the prior art of FIG. 2. In addition, there is another problem that the operation margin for the high-speed operation is small as the lines of the read data eRead, oRead and the write data eWrite, oWrite, and the lines of the node N4 and the like of the write register are long.

The prior art of FIG. 13 has a problem that the amount of the current consumed in the read operation is small, but the amount of the current consumed in the write operation is large similarly to the prior art of FIG. 2. In addition, there is another problem that the operation margin for the high-speed operation is small as the lines of the read data eRead, oRead and the write data eWrite, oWrite, and the lines of the node N1 and the like of the read register are long.

Moreover, in the above-described prior art, as the clock signals used for the serial/parallel conversion in the write operation and the parallel/serial conversion in the read operation cannot be controlled independently for every kind of the data, the writing and reading of the data can be performed only in the serial sequence, and the converted data sequence cannot be exchanged.

BRIEF SUMMARY OF THE INVENTION

A semiconductor memory device according to an aspect of the present invention comprises a memory cell array including plural memory cells, an input/output circuit inputting plural bits of serial data from outside and outputting the plural bits of serial data to outside, a register section comprising a first register and a second register, the first register receiving the plural bits of serial data from the input/output circuit and converting the plural bits of serial data into parallel data, the second register receiving plural bits of parallel data from the plural memory cells and converting the plural bits of parallel data into serial data, and a signal generating circuit generating plural first control signals and plural second control signals, the plural first control signals supplying a conversion timing for each bit when the plural bits of serial data are converted into the parallel data, the plural second control signals supplying a conversion timing for each bit when the plural bits of parallel data are converted into the serial data. The signal generating circuit controls a timing of one of rise and fall of the plural first control signals and sets which of the plural memory cells should store a value for each bit, of the plural bits of serial data, and controls a timing of one of rise and fall of the plural second control signals and sets which number of value of the serial data should be the value for each bit, of the plural bits of parallel data read from the plural memory cells.

BRIEF DESCRIPTION OF THE SEVERAL VIEWS OF THE DRAWING

FIGS. 28A and 28B are a table and a timing waveform chart showing an example of generating a control clock signal of the write operation shown in FIG. 27A by the signal generating circuit;

FIGS. 29A and 29B are a table and a timing waveform chart showing an example of generating a control clock signal of the read operation shown in FIG. 27B by the signal generating circuit;

DETAILED DESCRIPTION OF THE INVENTION

Figure 1:
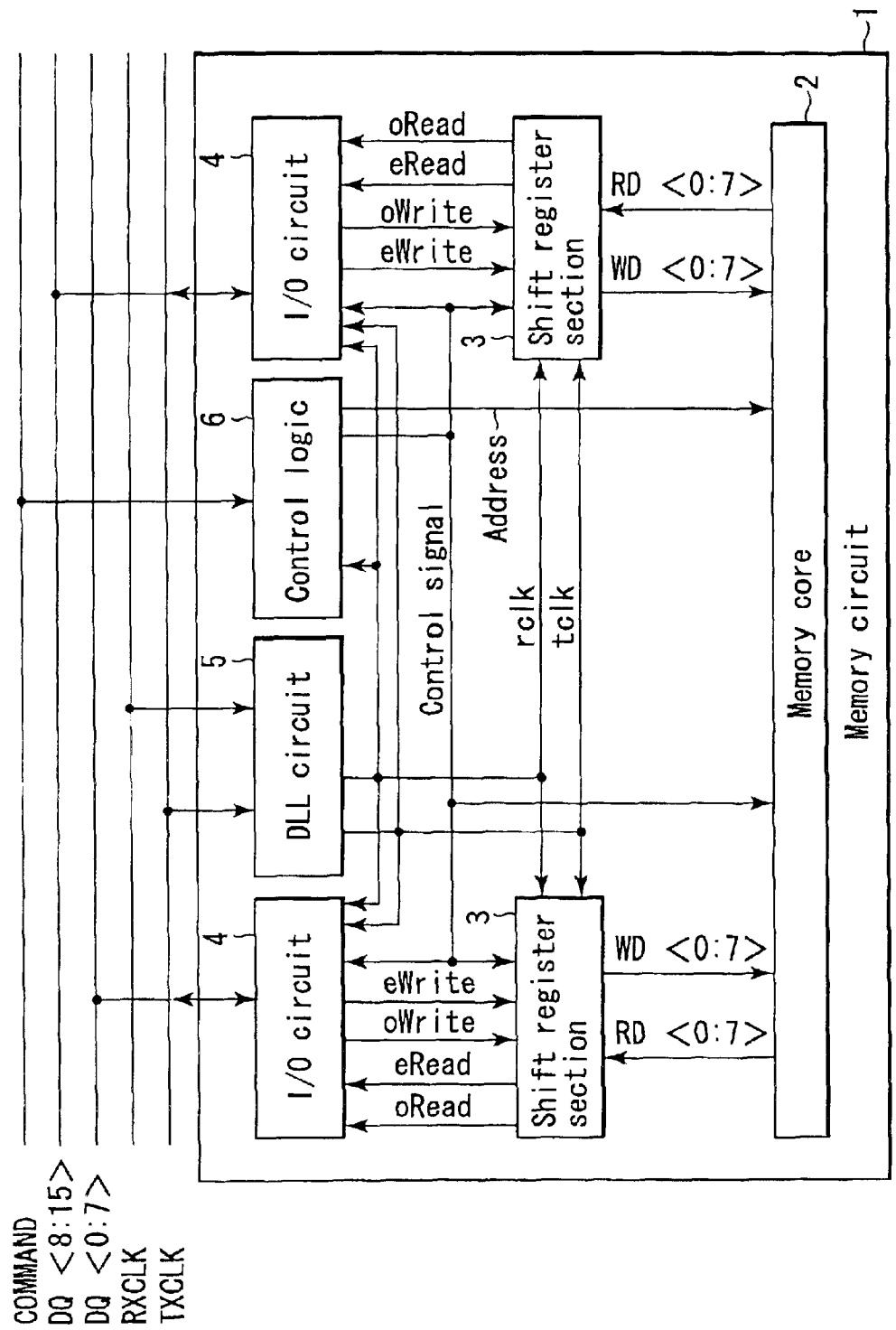
FIG. 1 is a block diagram showing a circuit configuration of a general high-frequency clock signal synchronizing memory.
Figure 2:
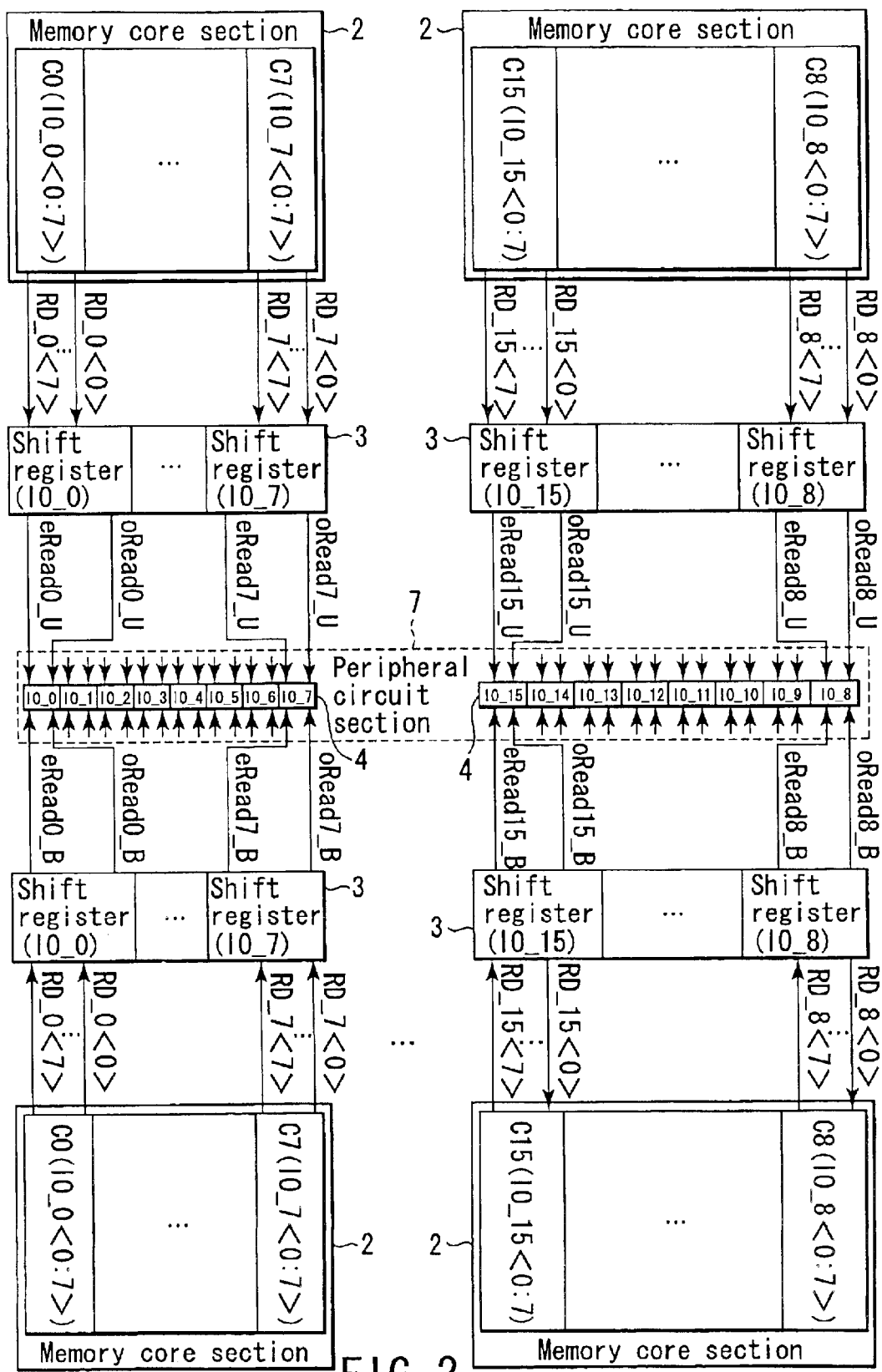
FIG. 2 is a view showing a path of read data in the high-frequency clock signal synchronizing memory of FIG. 1.
Figure 3A:
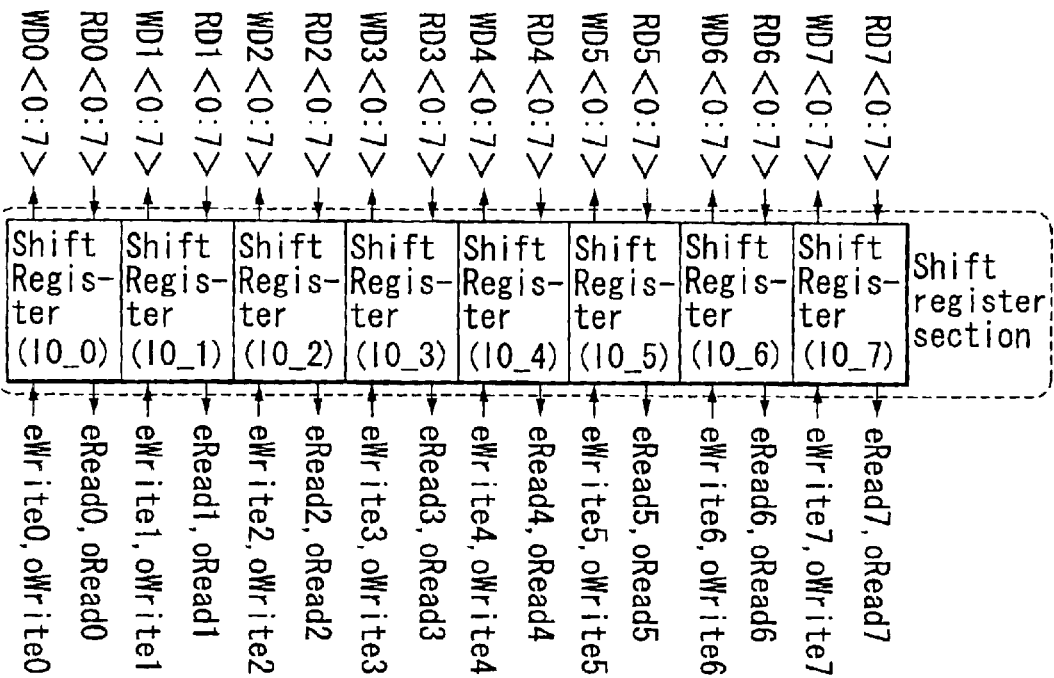
FIGS. 3A and 3B are views showing the configuration of the shift register section 3 in the high-frequency clock signal synchronizing memory shown in FIG. 1.
Figure 3B:
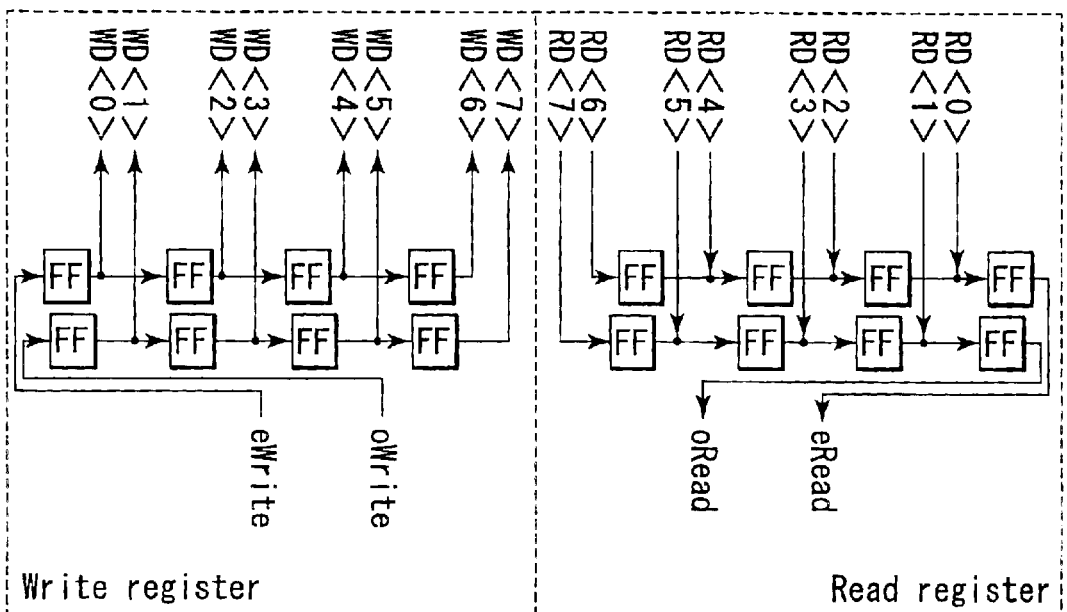
Figure 4:
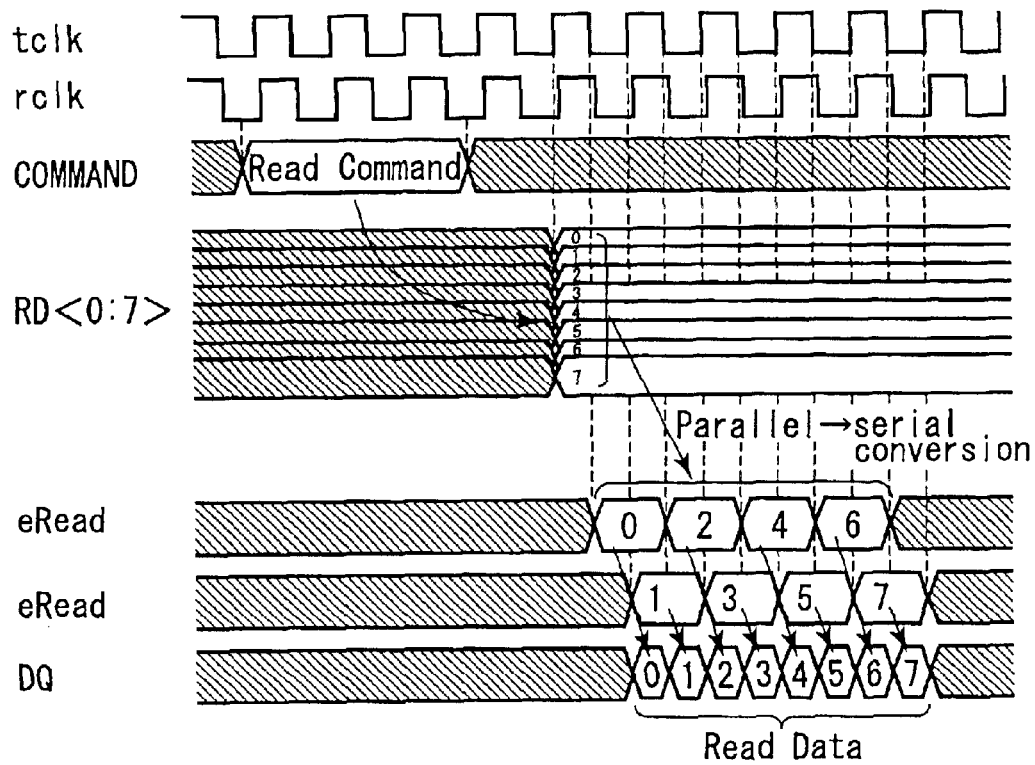
FIG. 4 is a timing waveform chart showing an example of a read operation in the high-frequency clock signal synchronizing memory shown in FIG. 1.
Figure 5:
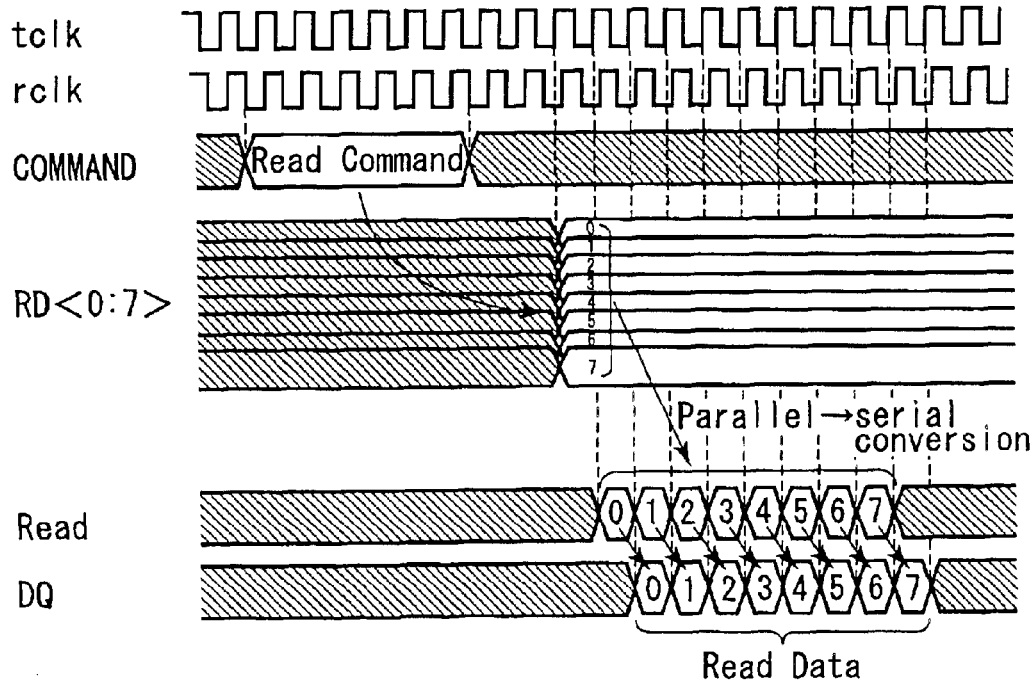
FIG. 5 is a timing waveform chart showing another example of the read operation in the high-frequency clock signal synchronizing memory shown in FIG. 1.
Figure 6:
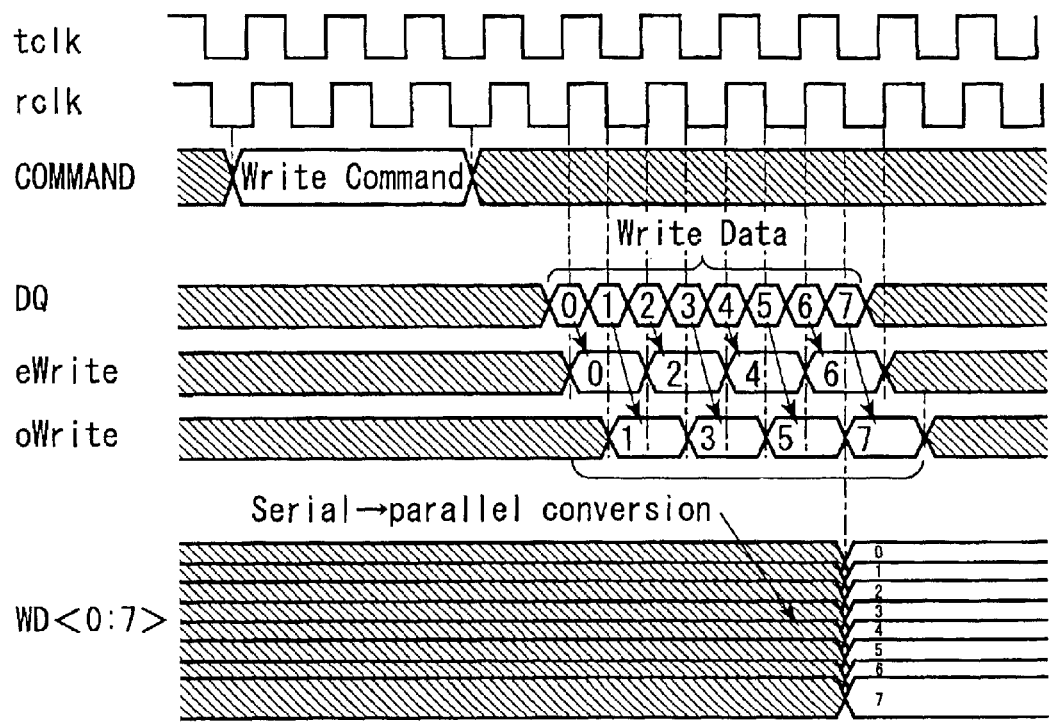
FIG. 6 is a timing waveform chart showing an example of a write operation in the high-frequency clock signal synchronizing memory shown in FIG. 1.
Figure 7:
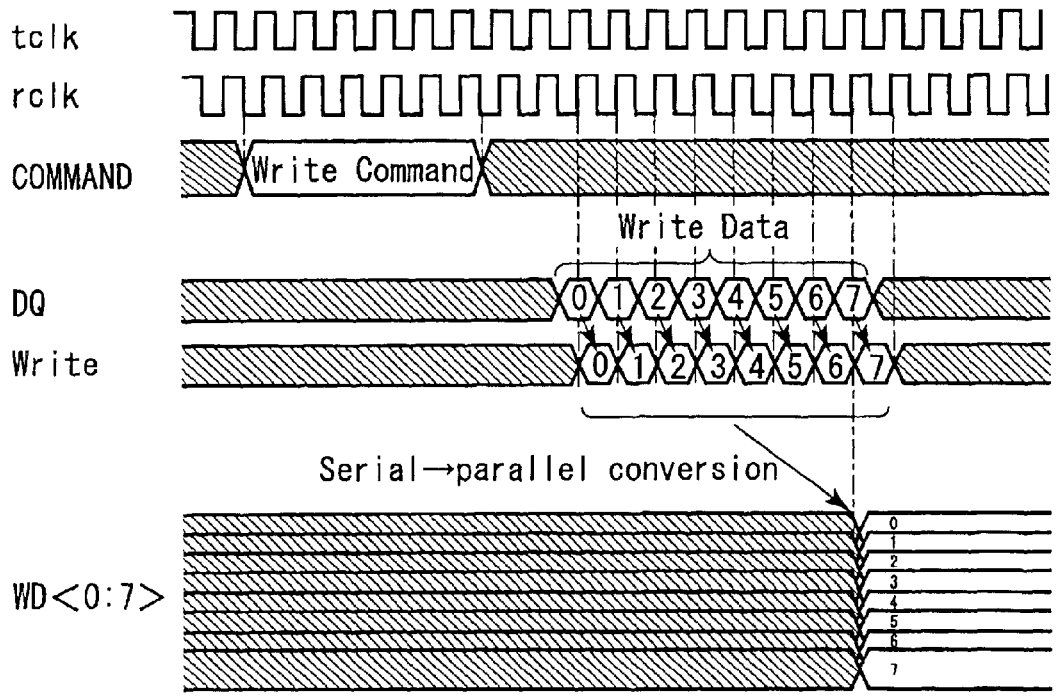
FIG. 7 is a timing waveform chart showing another example of the write operation in the high-frequency clock signal synchronizing memory shown in FIG. 1.
Figure 8A:
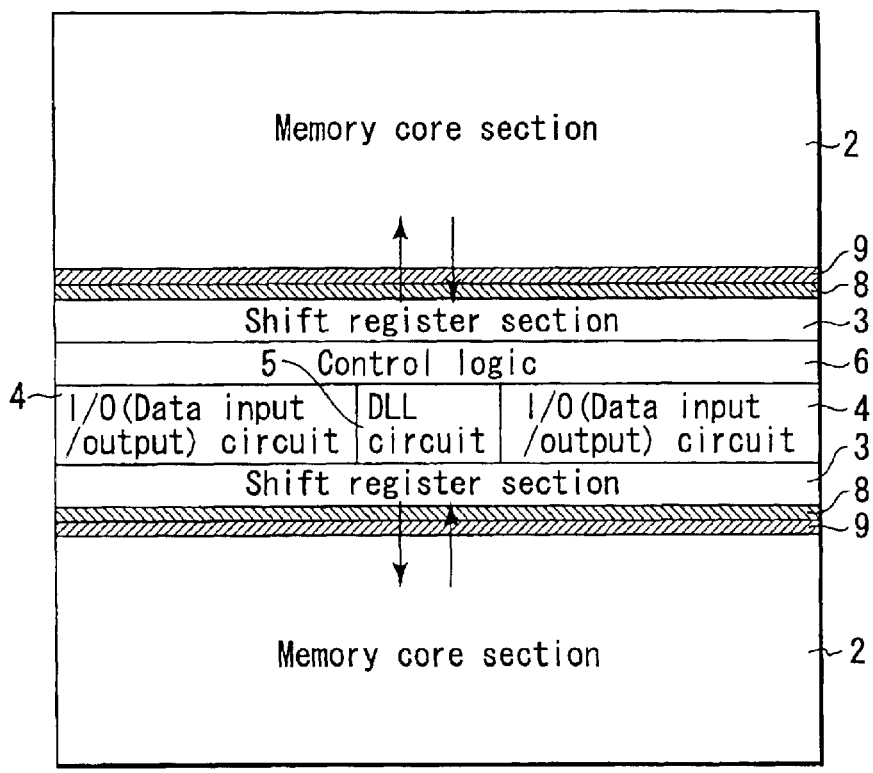
FIG. 8A is a view showing a layout of a conventional high-frequency clock signal synchronizing memory.
Figure 8B:
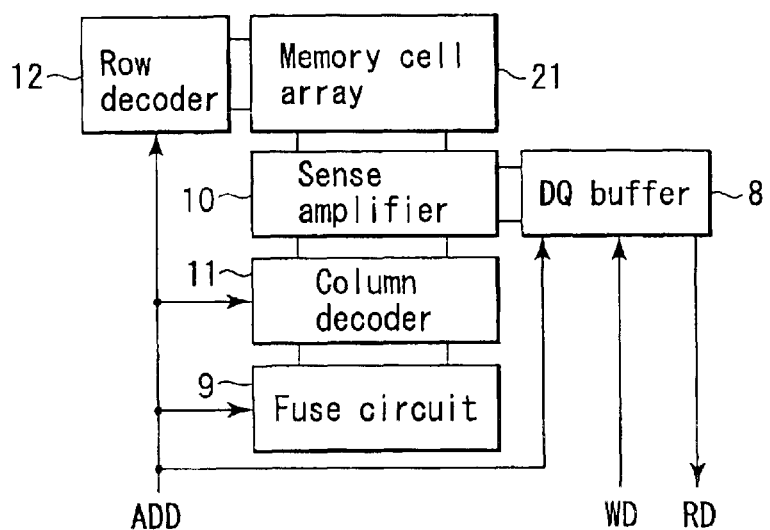
FIG. 8B is a view showing a configuration of a memory core section in the high-frequency clock signal synchronizing memory shown in FIG. 8A.
Figure 9:
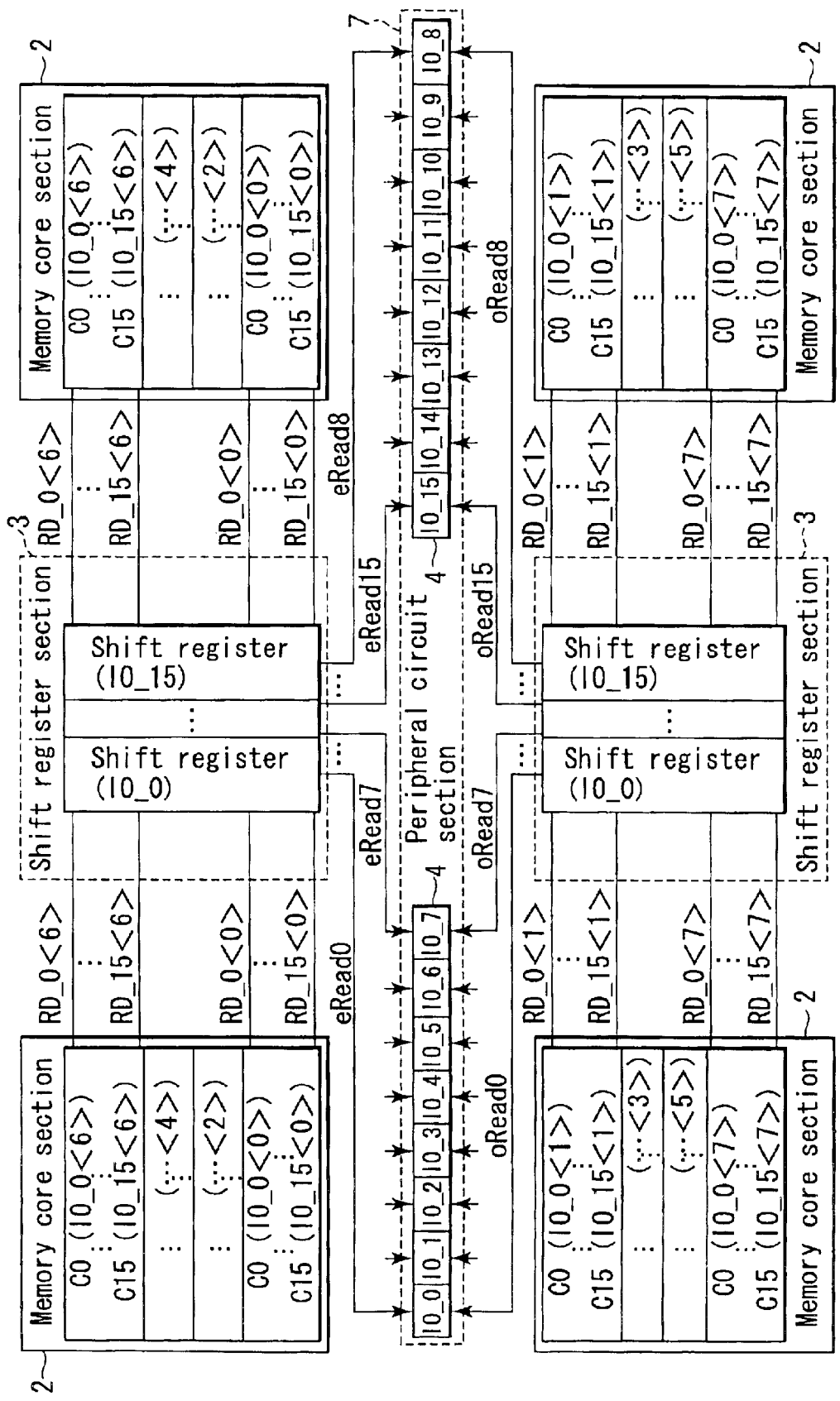
FIG. 9 is a block diagram showing an arrangement of main sections in another conventional high-frequency clock signal synchronizing memory.
Figure 10A:
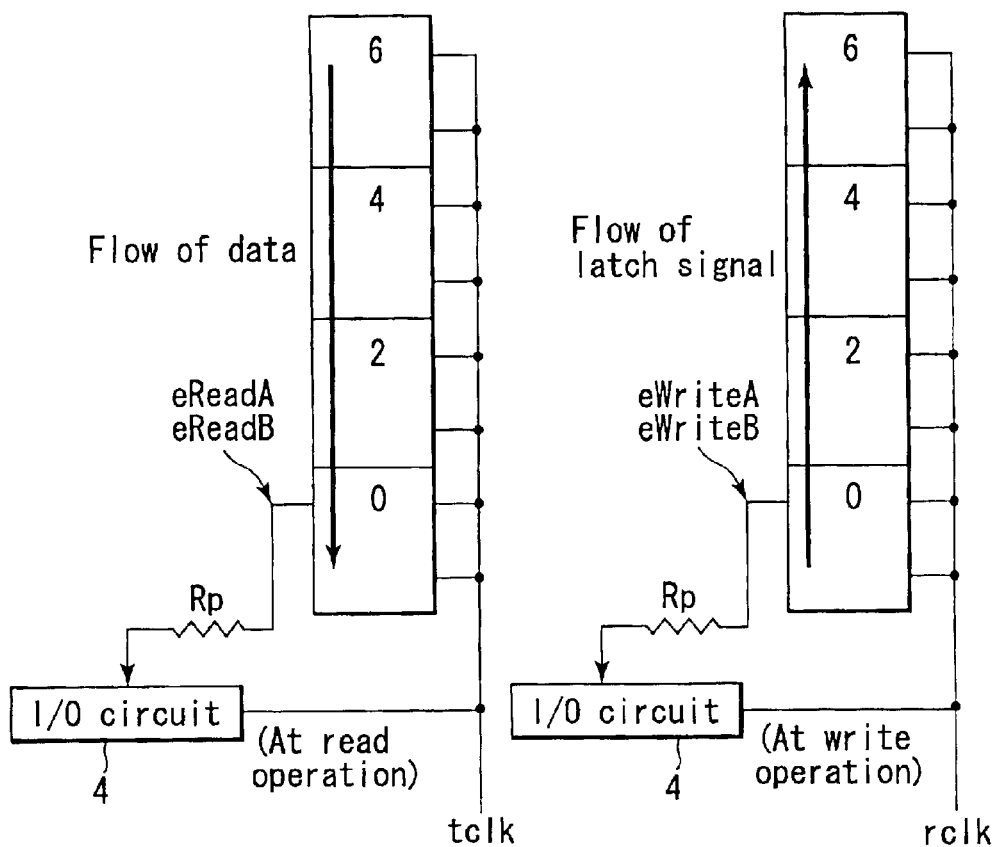
FIG. 10A is a view showing a configuration of a shift register on an even number side in a shift register section 3 of the high-frequency clock signal synchronizing memory shown in FIG. 9.
Figure 10B:
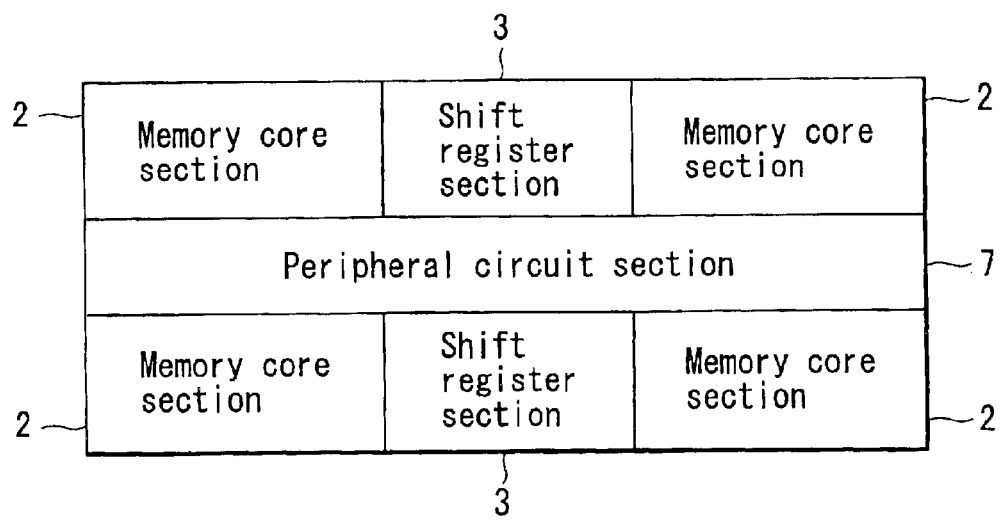
FIG. 10B is a schematic view showing a layout of the main sections of the high-frequency clock signal synchronizing memory shown in FIG. 9.
Figure 11:
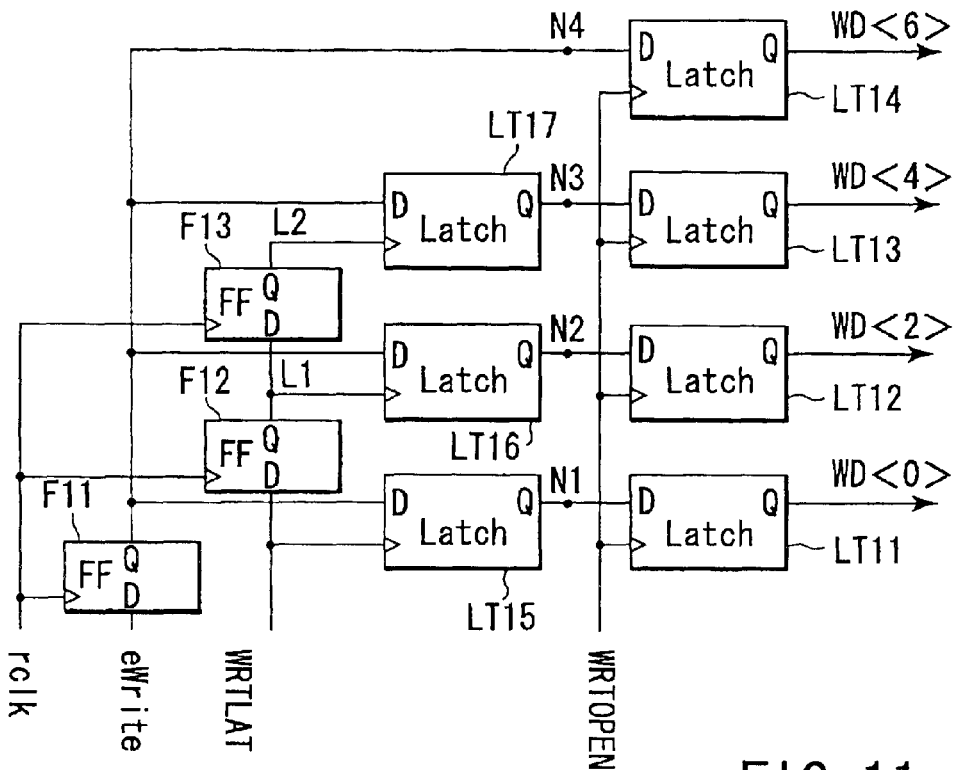
FIG. 11 is a circuit diagram showing a configuration of a write register in the high-frequency clock signal synchronizing memory shown in FIG. 9.
Figure 12:
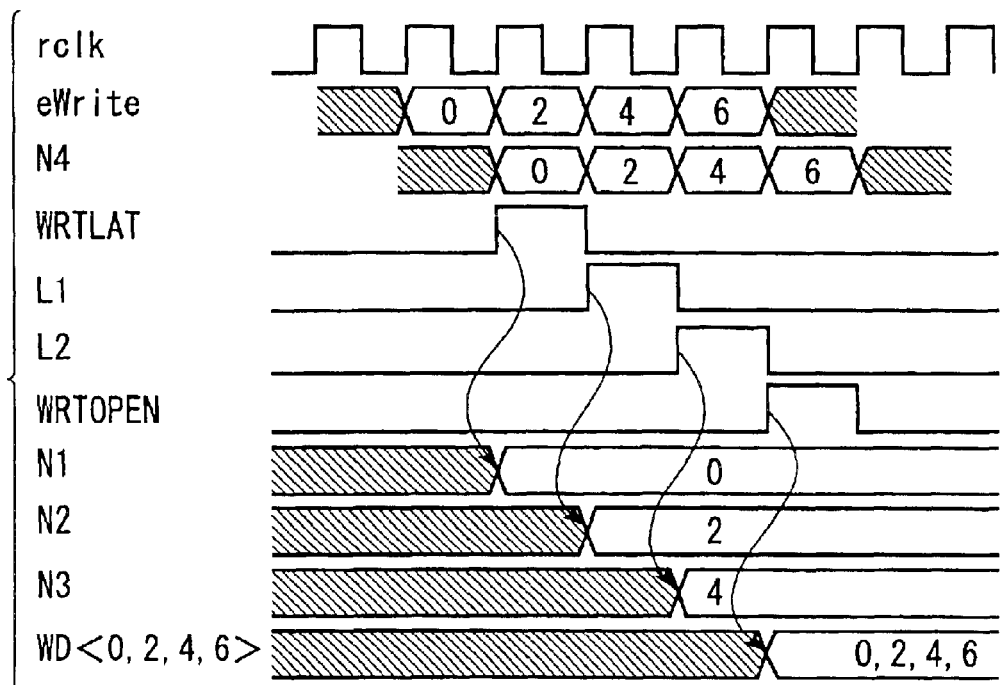
FIG. 12 is a timing waveform chart showing an example of a write operation using the write register shown in FIG. 11.
Figure 13:
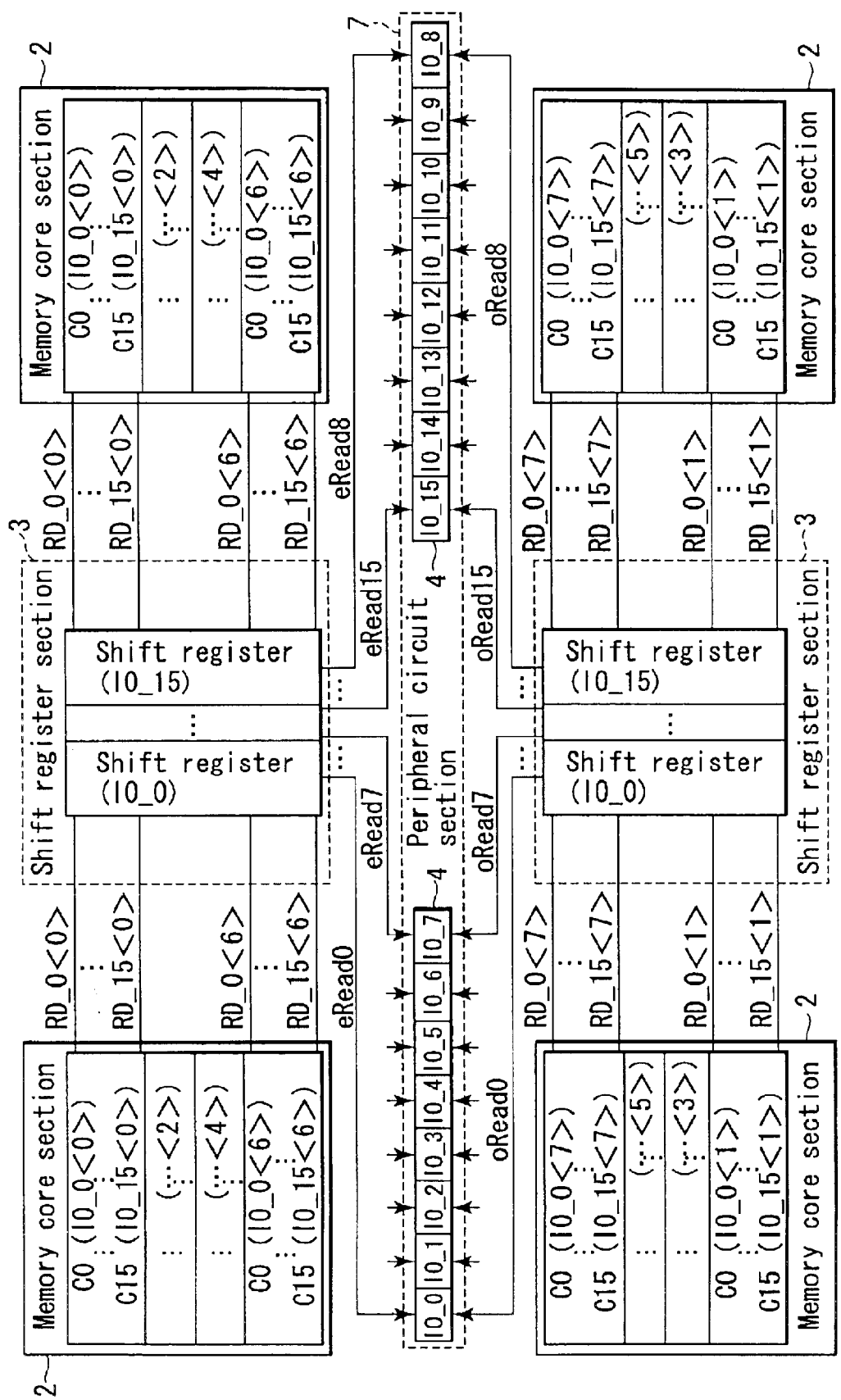
FIG. 13 is a block diagram showing another arrangement of the main sections in the conventional high-frequency clock signal synchronizing memory.
Figure 14A:
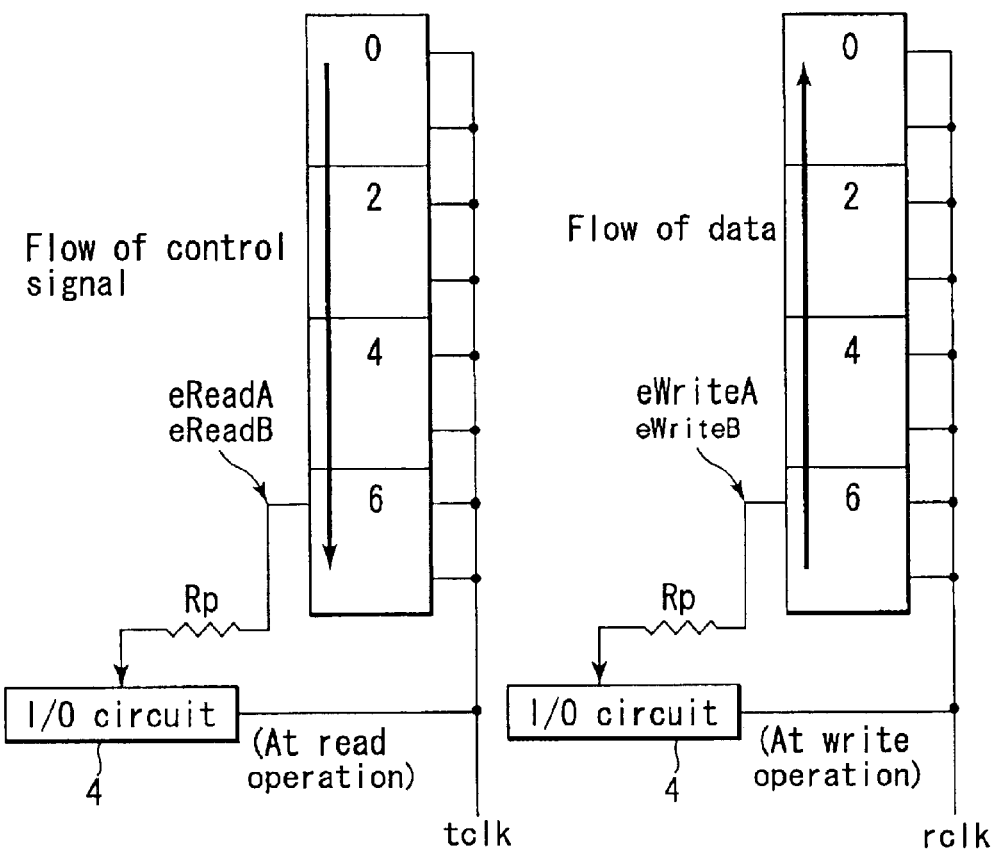
FIG. 14A is a view showing a configuration of a shift register on an even number side in a shift register section 3 of the high-frequency clock signal synchronizing memory shown in FIG. 13.
Figure 14B:
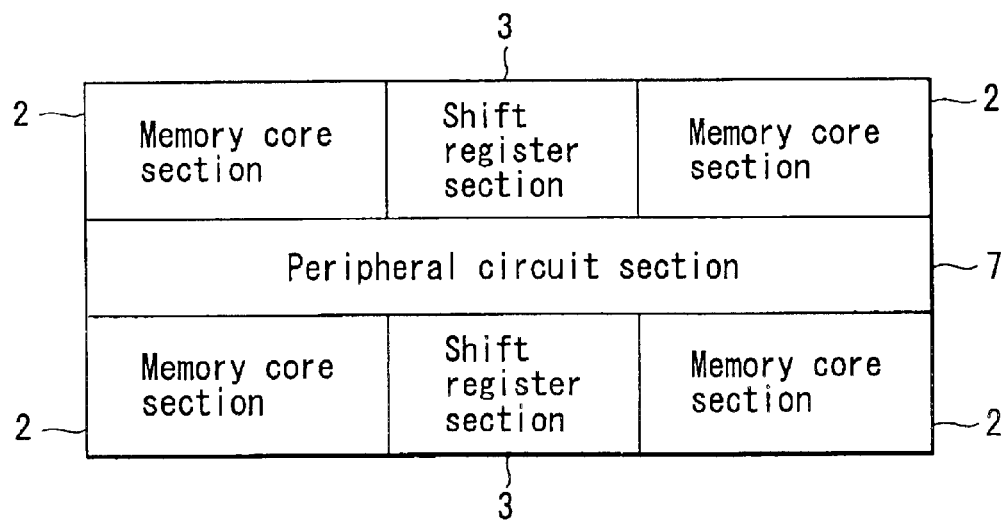
FIG. 14B is a schematic view showing a layout of the main sections of the high-frequency clock signal synchronizing memory shown in FIG. 13.
Figure 15:
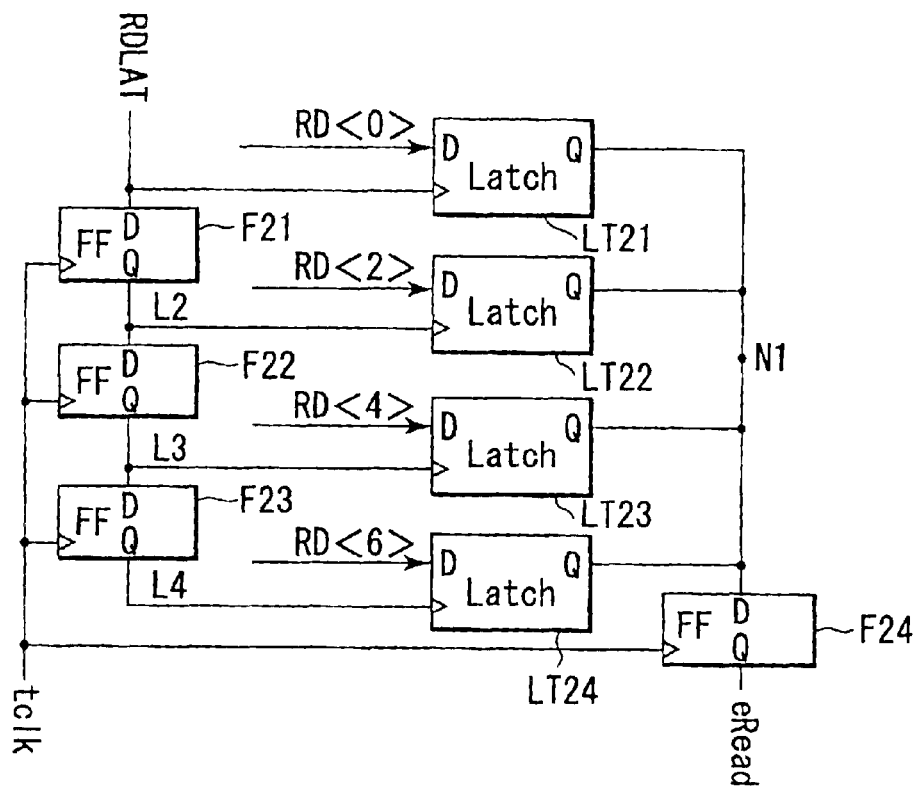
FIG. 15 is a circuit diagram showing a configuration of a read register in the high-frequency clock signal synchronizing memory shown in FIG. 13.
Figure 16:
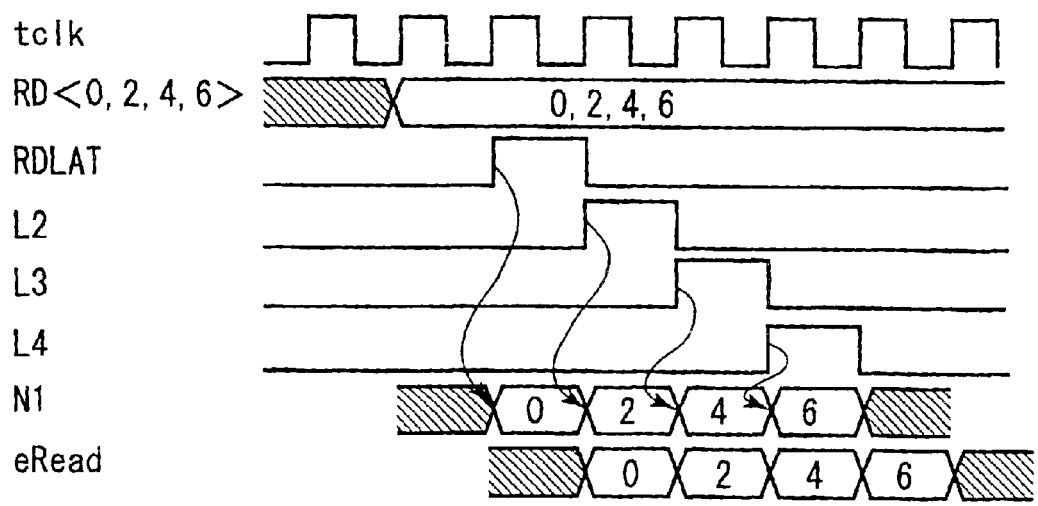
FIG. 16 is a timing waveform chart showing an example of a read operation using the read register shown in FIG. 15.

A semiconductor memory device according to embodiments of the present invention will be described below with reference to the accompanying drawings. A high-frequency clock signal synchronizing memory which inputs and outputs data synchronously with a high-frequency clock signal will now be explained as an example of the semiconductor memory device. In the accompanying drawings, like reference characters designate like or corresponding parts throughout the several drawings.

First Embodiment

First, a high-frequency clock signal synchronizing memory according to a first embodiment of the present invention will be explained.

Figure 17:
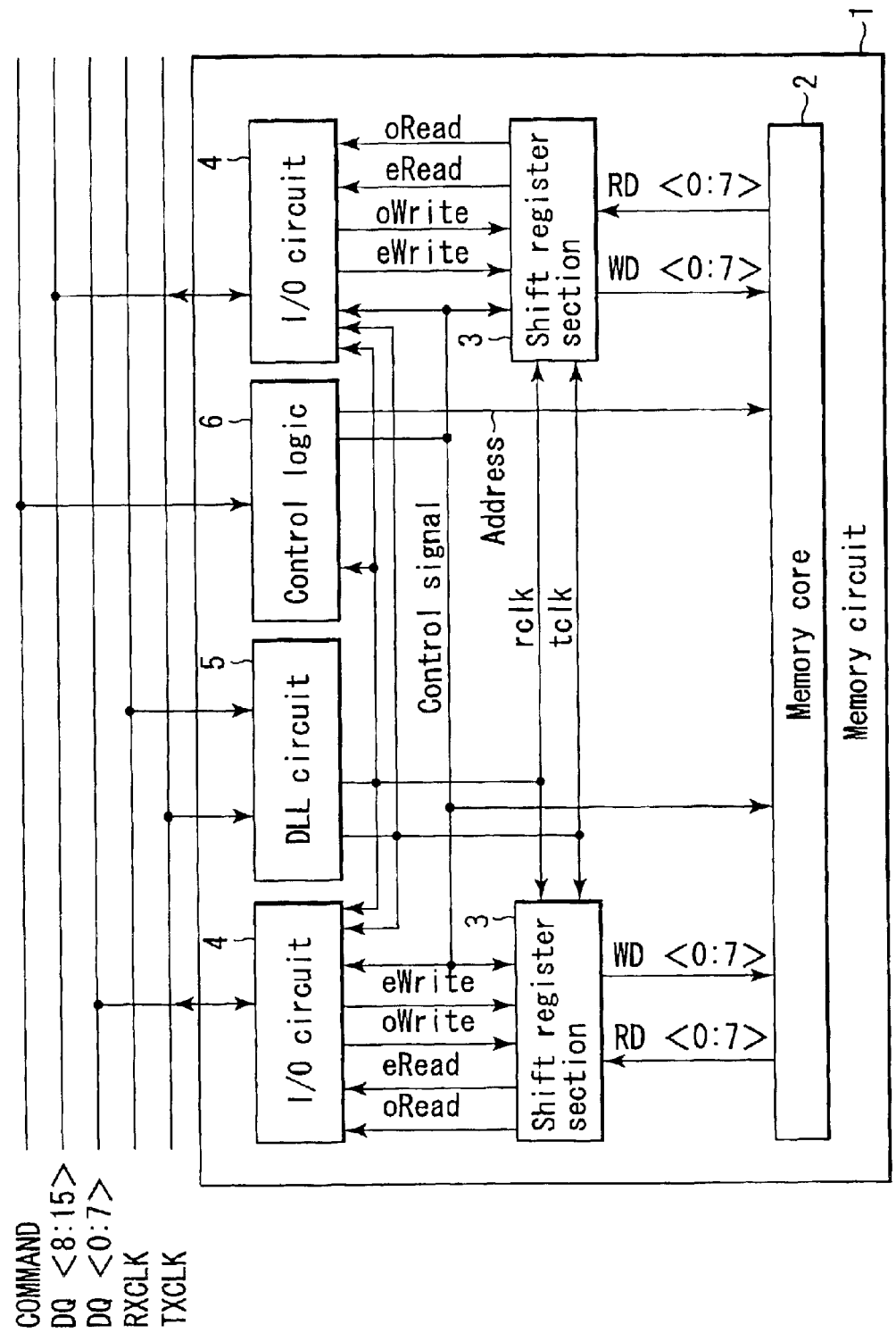
FIG. 17 is a block diagram showing a circuit configuration of a high-frequency clock signal synchronizing memory according to a first embodiment of the present invention.

FIG. 17 is a block diagram showing a circuit configuration of the high-frequency clock signal synchronizing memory according to the first embodiment.

A memory circuit 1 is roughly composed of a memory core section 2 and other I/F circuits.

The I/F circuits include right and left shift register sections 3 adjacent to the memory core section 2, right and left I/O circuits (input/output circuits) 4 arranged between external signal lines corresponding to the shift register sections 3 and the shift register sections 3, a DLL (Delayed Locked Loop) circuit 5, and a control logic 6.

The DLL circuit 5 generates a clock signal rclk controlling internal write data, synchronously with a write clock signal RXCLK which is input from outside, and also generates a clock signal tclk controlling internal read data, synchronously with a read clock signal TXCLK which is input from outside.

The control logic 6 performs a logic operation of a protocol which is input by an external command signal COMMAND and generates a control signal of the memory circuit 1.

The right and left I/O circuits 4 input serial write data DQ<8:15> and DQ<0:7> from external input/output data lines, respectively, and output internal serial write data eWrite and oWrite that are input to the right and left shift register sections 3 comprising a plurality of shift registers, by using the internal write data control clock signal rclk.

In addition, the right and left I/O circuits 4 input internal serial read data eRead and oRead from the right and left shift register sections 3, and output the serial read data DQ<8:15> and DQ<0:7> to the external input/output data lines, respectively, by using the internal read data control clock signal tclk.

<0:7> and <8:15> represent front 8-bit data and rear 8-bit data of totally 16-bit data, respectively. Letters "e" and "o" attached to Read and Write represent data of even numbers and data of odd numbers, respectively.

Each of the right and left shift register sections 3 inputs internal parallel read data RD<0:7> which is read from the memory core section 2 by the control signal during the read operation, and outputs internal parallel write data WD<0:7> by the control signal and writes the data to the memory core section 2 during the write operation.

Thus, the right and left shift register sections 3, arranged between the right and left I/O circuits 4 and the memory core section 2, convert the internal parallel read data RD<0:7> into the internal serial read data eRead and oRead during the read operation, and convert the internal serial write data eWrite and oWrite into the internal parallel write data WD<0:7> during the write operation.

The memory core section 2 is composed of a general DRAM circuit that consists of a row decoder, a column decoder, a memory cell array, a sense amplifier, a redundancy fuse and a DQ buffer.

Figure 18:
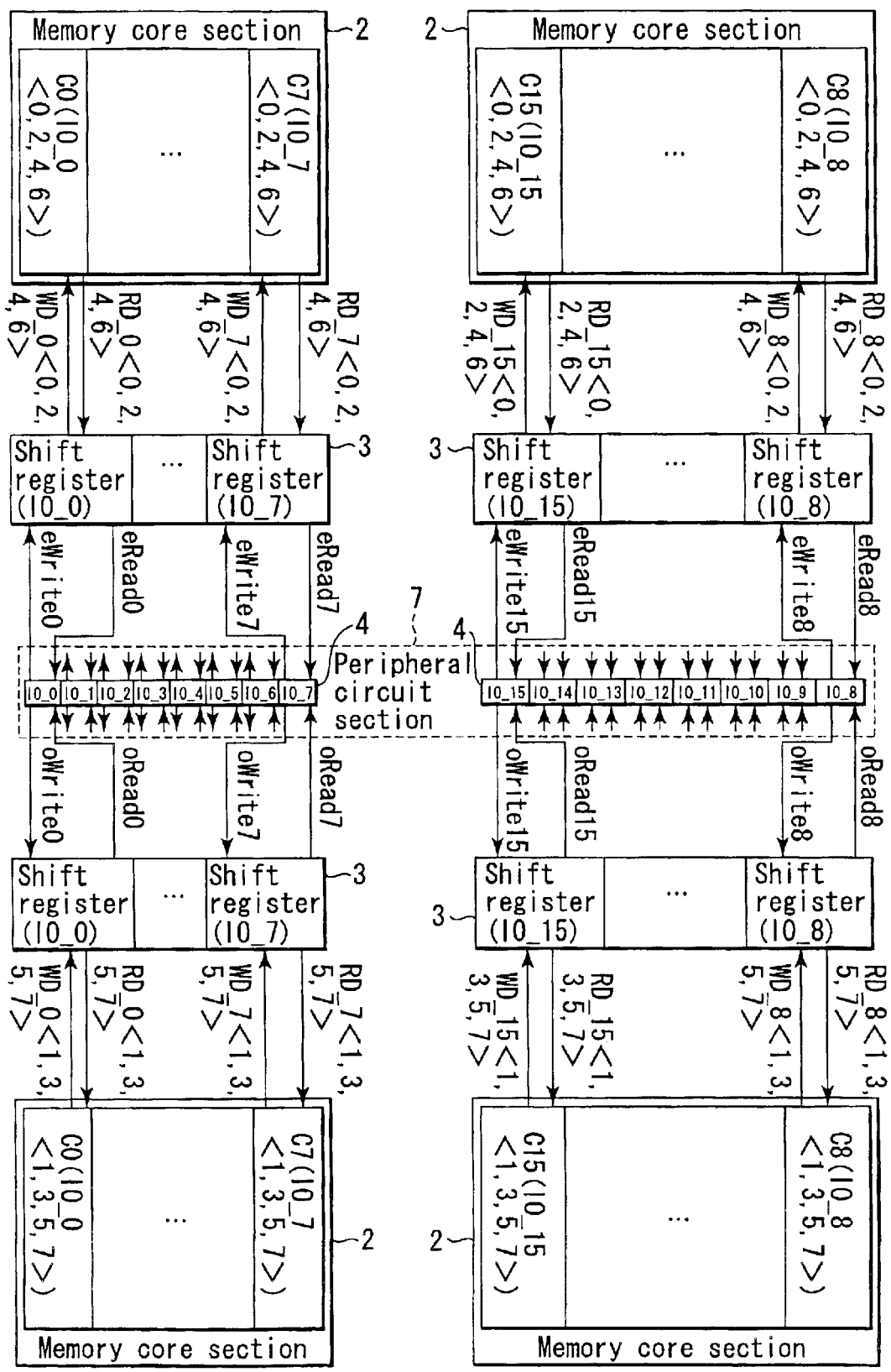
FIG. 18 is a block diagram showing an arrangement of main sections in the high-frequency clock signal synchronizing memory according to the first embodiment of the present invention.

FIG. 18 is a block diagram showing an arrangement of main sections in the high-frequency clock signal synchronizing memory according to the first embodiment.

The memory core sections 2, the shift register sections 3 and the peripheral circuit sections 7 are arranged as shown in FIG. 18. The peripheral circuit sections 7 comprise the I/O circuits 4, the DLL circuit 5, and the control logic 6. The I/O circuits 4 are divided into IO_0, IO_1, ..., IO_7 and IO_8, IO_9, ..., IO_15, which are arranged on right and left sides.

Serial write data DQ<0:7> is input from the outside to the IO_0 to IO_7, and serial write data eWrite<0:7> and oWrite<0:7> are output from the IO_0 to IO_7. Serial write data DQ<8:15> is input from the outside to the IO_8 to IO_15, and serial write data eWrite<8:15> and oWrite<8:15> are output from the IO_8 to IO_15.

In addition, serial read data eRead<0:7> and oRead<0:7> are input to the IO_0 to IO_7, and external serial read data DQ<0:7> is output from the IO_0 to IO_7. Serial read data eRead<8:15> and oRead<8:15> are input to the IO_8 to IO_15, and external serial read data DQ<8:15> is output from the IO_8 to IO_15.

The shift register sections 3 include shift registers for even numbers and shift registers for odd numbers. The shift registers are arranged for even numbers and odd numbers are arranged separately, on the upper and lower sides of the IO_0 to IO_7 and on the upper and lower sides of the IO_8 to IO_15. Furthermore, the shift register sections 3 are assembled for corresponding IOs, of the IO_0 to IO_7 and IO_8 to IO_15 of the I/O circuits 4 (the corresponding IOs are represented in parentheses).

The memory core sections 2 are divided into four, which are arranged on the upper and lower sides of the shift registers for even numbers and odd numbers as shown in FIG. 18. 8-bit cell regions C0 to C7 are assigned to the left memory core sections 2 to correspond to respective 8-bit IO_0 to IO_7 of the I/O circuit 4. Similarly, 8-bit cell regions C8 to C15 are assigned to the memory core sections 2 of the right side to correspond to respective 8-bit IO_8 to IO_15. The high-frequency clock signal synchronizing memory is therefore configured to have totally 16-bit input and output width.

Thus, the 8-bit regions C0 to C15 corresponding to the sequence of input and output to respective IO_0<0:7> to IO_15<0:7> are assigned to the memory cell arrays as represented by the memory core sections 2 of FIG. 18. In an active operation of the high-frequency clock signal synthesizing memory, two of four divided memory core sections, i.e. the upper left and lower right memory core sections or the lower left and upper right memory core sections are selected.

Figure 19A:
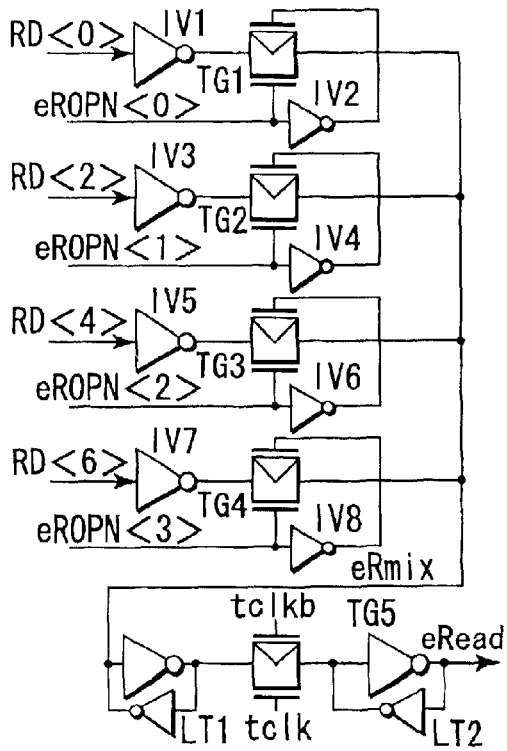
FIG. 19A is a circuit diagram showing a configuration of a read register on an even number side in the high-frequency clock signal synchronizing memory according to the first embodiment of the present invention.
Figure 19B:
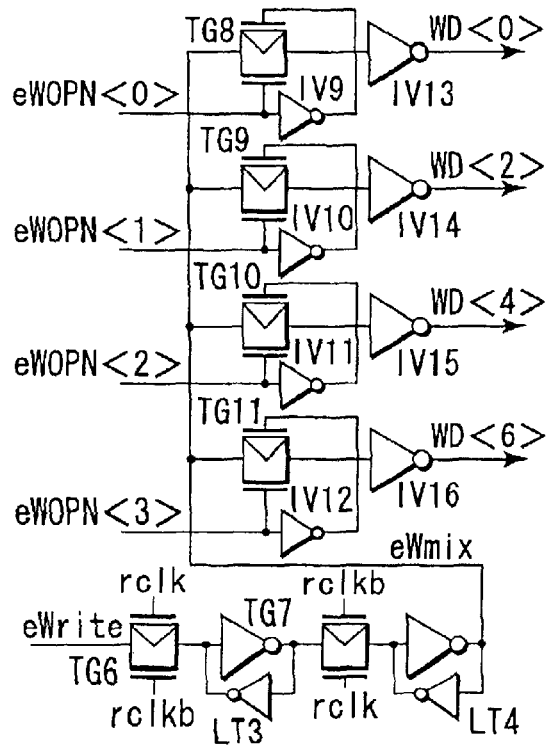
FIG. 19B is a circuit diagram showing a configuration of a write register on an even number side in the high-frequency clock signal synchronizing memory according to the first embodiment of the present invention.
Figure 20A:
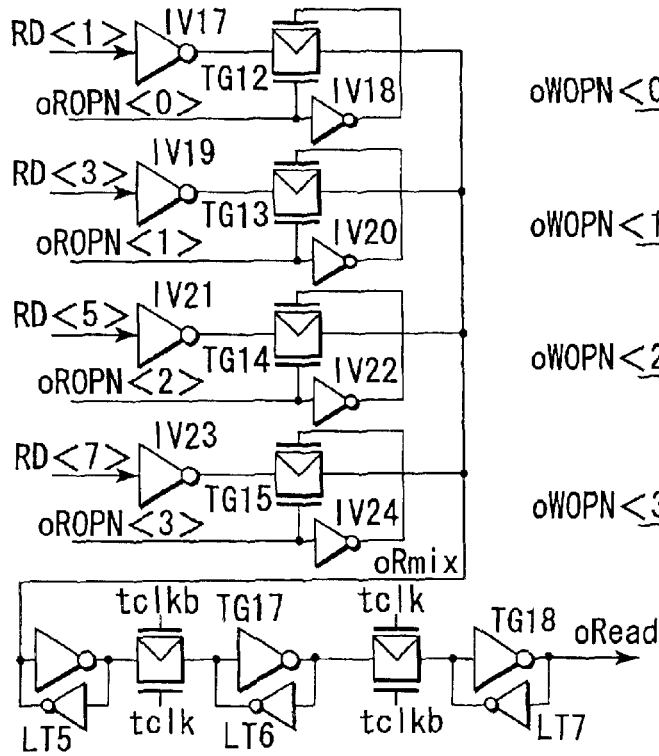
FIG. 20A is a circuit diagram showing a configuration of a read register on an odd number side in the high-frequency clock signal synchronizing memory according to the first embodiment of the present invention.
Figure 20B:
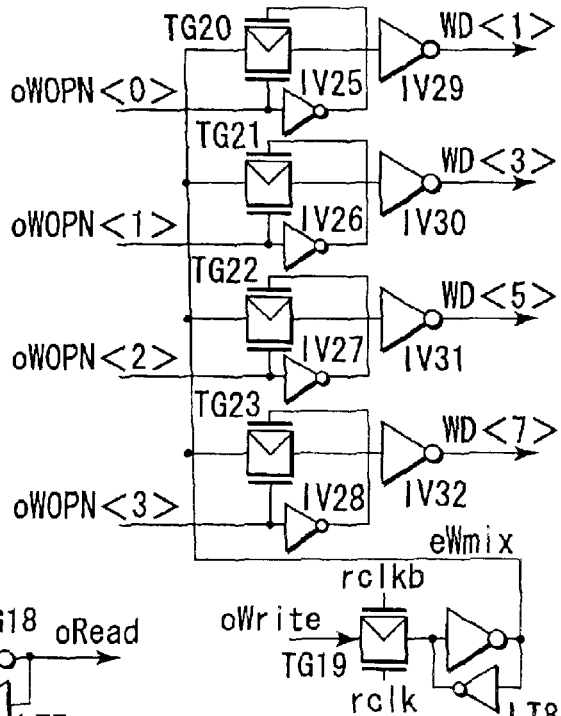
FIG. 20B is a circuit diagram showing a configuration of a write register on an odd number side in the high-frequency clock signal synchronizing memory according to the first embodiment of the present invention.

FIG. 19A, FIG. 19B and FIG. 20A, FIG. 20B are circuit diagrams showing configurations of the read registers and the write registers which the shift registers for even numbers and odd numbers comprise. FIG. 19A shows the read register for even numbers and FIG. 19B shows the write register for even numbers. FIG. 20A shows the read register for odd numbers and FIG. 20B shows the write register for odd numbers.

Parallel read data RD<0> is input to an end of current path of a transfer gate TG1 through a NOT circuit IV1 as shown in FIG. 19A. A signal eROPN<0> is input to one of gates of the transfer gate TG1 and the signal eROPN<0> is input to the other gate thereof through a NOT circuit IV2.

Similarly, parallel read data RD<2>, RD<4>, and RD<6> are input to one-side ends of current paths of transfer gates TG2, TG3, and TG4 through NOT circuits IV3, IV5, and IV7, respectively. Signals eROPN<1>, eROPN<2>, and eROPN<3> are input to one-side gates of the transfer gates TG2, TG3, and TG4. The signals eROPN<1>, eROPN<2>, and eROPN<3> are also input to the other gates thereof through NOT circuits IV4, IV6, and IV8, respectively.

The other ends of the current paths of the transfer gates TG1, TG2, TG3, and TG4 are connected to a latch circuit LT2 through a latch circuit LT1 and a transfer gate TG5. The serial read data eRead is output from the latch circuit LT2.

The serial write data eWrite is input to one-side ends of current paths of transfer gates TG8 to TG11, through a transfer gate TG6, a latch circuit LT3, a transfer gate TG7, and a latch circuit LT4 in sequence, as shown in FIG. 19B. Signals eWOPN<0>, eWOPN<1>, eWOPN<2>, and eWOPN<3> are input to one-side gates of the transfer gates TG8 to TG11, respectively. The signals eWOPN<0>, eWOPN<1>, eWOPN<2>, and eWOPN<3> are also input to the other gates thereof through NOT circuits IV9 to IV12, respectively.

Parallel write data WD<0>, WD<2>, WD<4>, and WD<6> are output from the other ends of the current paths of the transfer gates TG8 to TG11, through NOT circuits IV13 to IV16, respectively.

Parallel read data RD<1> is input to an end of a current path of a transfer gate TG12 through a NOT circuit IV17, as shown in FIG. 20A. Signal oROPN<0> is input to one of gates of the transfer gate TG12. The signal oROPN<0> is also input to the other gate thereof through a NOT circuit IV18.

Similarly, parallel read data RD<3>, RD<5>, and RD<7> are input to one-side ends of current paths of transfer gates TG13, TG14, and TG15 through NOT circuits IV19, IV21, and IV23, respectively. Signals oROPN<1>, oROPN<2>, and oROPN<3> are input to one-side gates of the transfer gates TG13, TG14, and TG15. The signals oROPN<1>, oROPN<2>, and oROPN<3> are also input to the other gates thereof through NOT circuits IV20, IV22, and IV24, respectively.

The other ends of the current paths of the transfer gates TG12 to TG15 are connected to a latch circuit LT7 through a latch circuit LT5, a transfer gate TG17, a latch circuit LT6, and a transfer gate TG18 in sequence. The serial read data oRead is output from the latch circuit LT7.

The serial write data oWrite is input to one-side ends of current paths of transfer gates TG20 to TG23, through a transfer gate TG19 and a latch circuit LT8 in sequence, as shown in FIG. 20B. Signals oWOPN<0>, oWOPN<1>, oWOPN<2>, and oWOPN<3> are input to one-side gates of the transfer gates TG20 to TG23, respectively. The signals oWOPN<0>, oWOPN<1>, oWOPN<2>, and oWOPN<3> are also input to the other gates thereof through NOT circuits IV25 to IV28, respectively.

Parallel write data WD<1>, WD<3>, WD<5>, and WD<7> are output from the other ends of the current paths of the transfer gates TG20 to TG23, through the NOT circuits IV29 to IV32, respectively.

Next, parallel/serial conversion performed by the read register shown in FIG. 19A and FIG. 20A, and serial/parallel conversion performed by the write register shown in FIG. 19B and FIG. 20B, will be explained.

Figure 21:
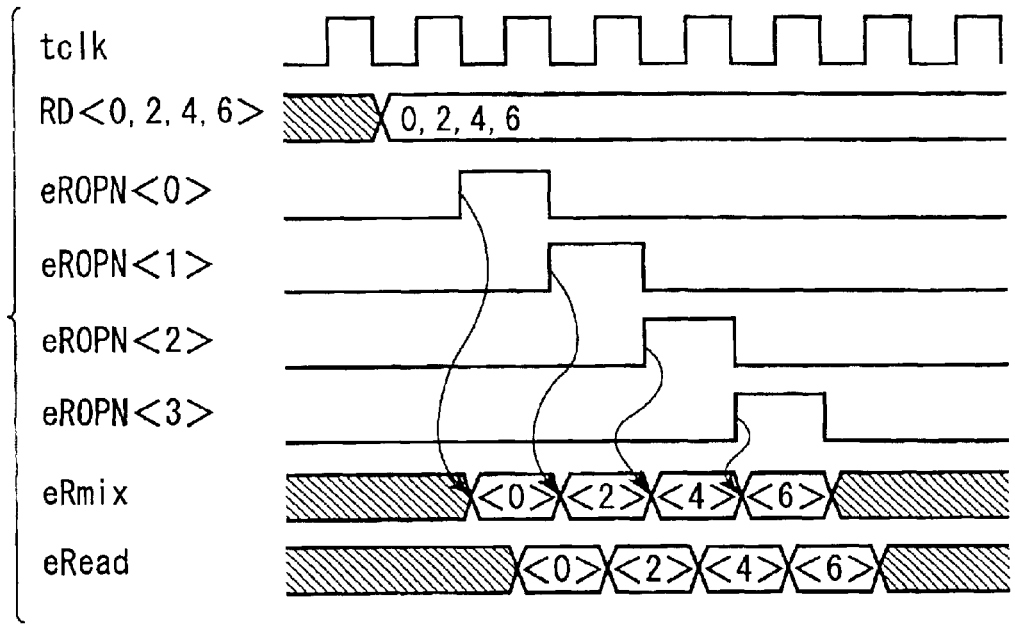
FIG. 21 is a timing waveform chart showing a parallel/serial conversion of the read register shown in FIG. 19A.

FIG. 21 is a timing waveform chart showing a parallel/serial conversion of the read register shown in FIG. 19A.

The read register for even numbers converts the parallel read data RD<0, 2, 4, 6> that are 4-bit parallel inputs, into the serial read data eRead that is the 4-bit serial output, during the read operation.

Four signals eROPN<0:3> having timings differing by one cycle synchronously with the clock signal tclk, sequentially become "H" during a period of one cycle of the clock signal tclk, after the parallel read data RD <0, 2, 4, 6> are read from the memory core section 2. In response to the rise of the signals eROPN<0:3>, the parallel read data RD<0>, RD<2>, RD<4>, and RD<6> are sequentially output from the transfer gates TG1 to TG4, and the signal eRmix becomes the serial read data <0, 2, 4, 6>. The signal eRead is delayed by half a cycle in becoming the serial read data <0, 2, 4, 6>.

Figure 22:
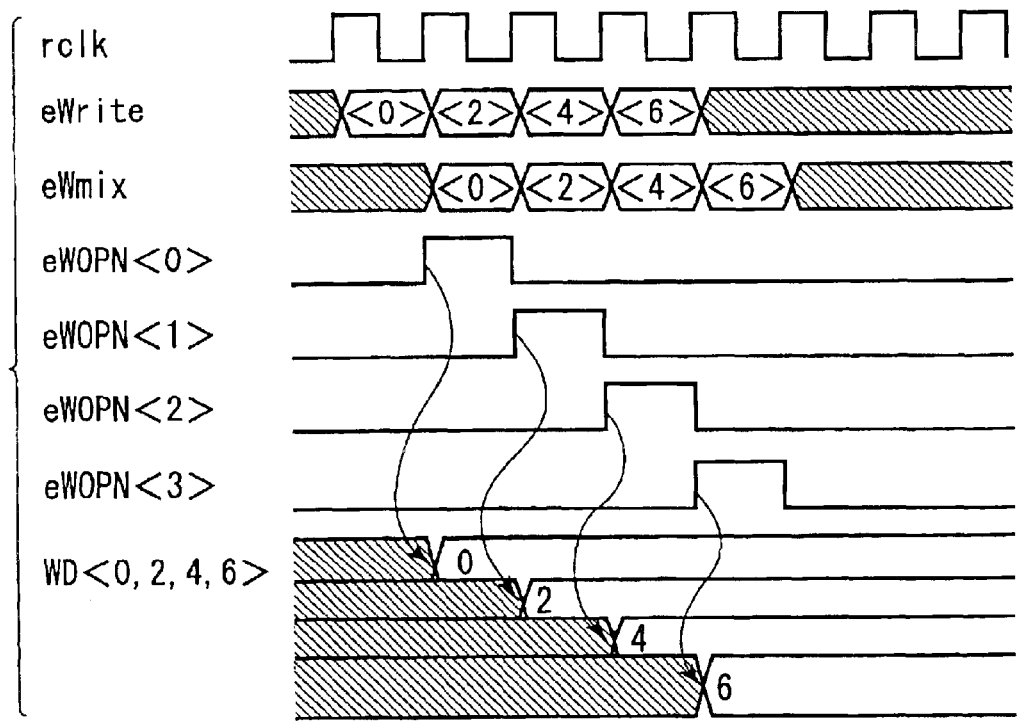
FIG. 22 is a timing waveform chart showing a serial/parallel conversion of the write register shown in FIG. 19B.

FIG. 22 is a timing waveform chart showing a serial/parallel conversion of the write register shown in FIG. 19B.

The write register for even numbers converts the serial write data eWrite that is the 4-bit serial input, into the parallel write data WD<0, 2, 4, 6> that are 4-bit parallel outputs, during the read operation.

The serial write data eWrite are input in sequence of <0, 2, 4, 6>, from outside to the transfer gate TG6 of the write register. Then, the serial write data eWrite<0, 2, 4, 6> are delayed by one cycle in being sequentially output from the latch circuit LT4, synchronously with the clock signal rclk (signal eWmix). In accordance with this, the signals eWOPN<0:3> sequentially become "H" during a period of one cycle, synchronously with the clock signal rclk. In response to the rise of the signals eWOPN<0:3>, the signal eWmix is input to the transfer gates TG8 to TG11, and the parallel write data WD<0>, WD<2>, WD<4>, and WD<6> are output from the NOT circuits IV13 to IV16.

Figure 23:
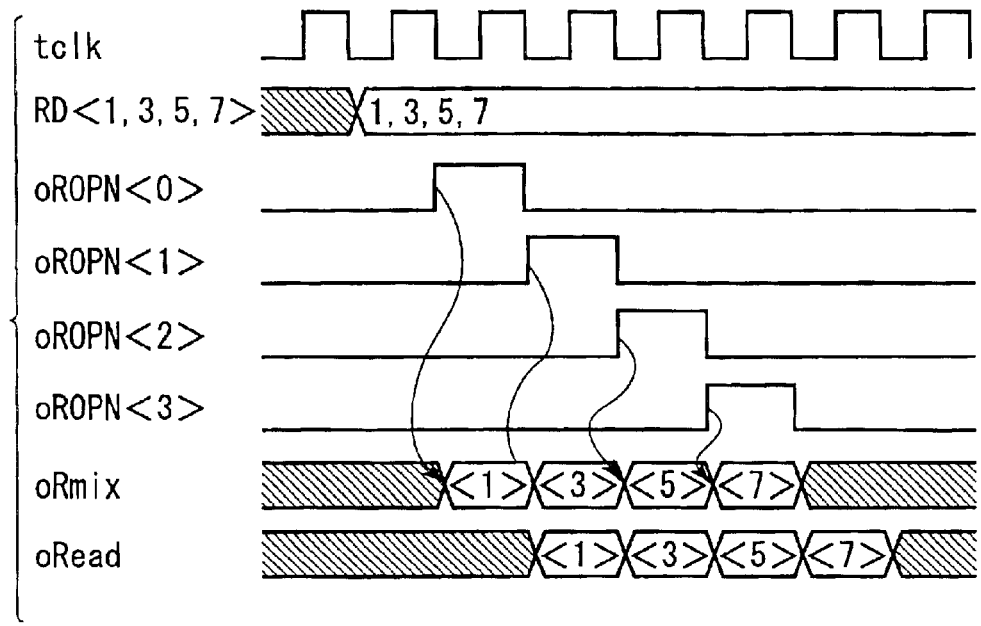
FIG. 23 is a timing waveform chart showing a parallel/serial conversion of the read register shown in FIG. 20A.

FIG. 23 is a timing waveform chart showing a parallel/serial conversion of the read register shown in FIG. 20A.

The read register for odd numbers converts the parallel read data RD <1, 3, 5, 7> that are 4-bit parallel inputs, into the serial read data oRead that is the 4-bit serial output, during the read operation.

Four signals oROPN<0:3> having timings differing by one cycle synchronously with the clock signal tclk, sequentially become "H" during a period of one cycle of the clock signal tclk, after the parallel read data RD <1, 3, 5, 7> are read from the memory core section 2. In response to the rise of the signals oROPN<0:3>, the parallel read data RD<1>, RD<3>, RD<5>, and RD<7> are sequentially output from the transfer gates TG12 to TG15, and the signal oRmix becomes the serial read data <1, 3, 5, 7>. The signal oRead is delayed by one cycle from the signal oRmix in becoming the serial read data <1, 3, 5, 7>. That is, the read register for odd numbers is operated similarly, at the same timing as the read register for even numbers until the signal oRmix is output, and outputs the serial read data oRead at a timing delayed by half a cycle from the serial read data eRead by the transfer gates and the latch circuits.

Figure 24:
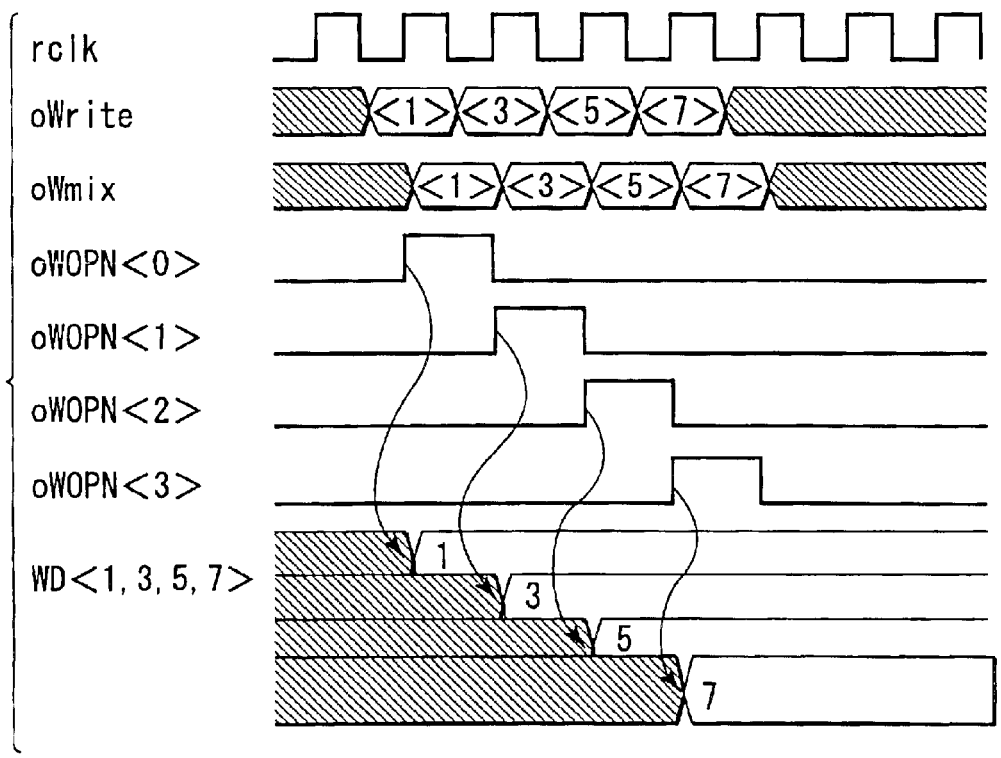
FIG. 24 is a timing waveform chart showing a serial/parallel conversion of the write register shown in FIG. 20B.

FIG. 24 is a timing waveform chart showing a serial/parallel conversion of the write register shown in FIG. 20B.

The write register for odd numbers converts the serial write data oWrite that is the 4-bit serial input, into the parallel write data WD<1, 3, 5, 7> that are the 4-bit parallel outputs, during the write operation.

The serial write data oWrite are input in sequence of <1, 3, 5, 7>, from outside to the transfer gate TG19. Then, the serial write data eWrite <1, 3, 5, 7> are delayed by half a cycle, in being sequentially output from the latch circuit LT8, synchronously with the clock signal rclk (signal oWmix). In accordance with this, the signals eWOPN<0:3> sequentially become "H" during a period of one cycle, synchronously with the clock signal rclk. In response to the rise of the signals eWOPN<0:3>, the signal oWmix is input to the transfer gates TG20 to TG23, and the parallel write data WD<0>, WD<2>, WD<4>, and WD<6> are output from the NOT circuits IV29 to IV32.

The serial write data oWrite is input to the write register for odd numbers, at a timing delayed by half a cycle, as compared with the serial write data eWrite. However, the timing of outputting the signal eWmix becomes the same as the timing of outputting the signal oWmix. After this, the operation is performed at the same timing.

As described above, by using the read registers and the write registers having the above-described configuration for both the read operation and the write operation, the number of transistors to which the clock signal is input can be remarkably reduced as compared with the prior art using a number of flip-flops in the read registers and the write registers. Thus, the amount of the current consumed in the read operation and the write operation can be reduced. Incidentally, the flip-flop comprises a number of transfer gates and a number of transistors.

In addition, in the above-described high-frequency clock signal synchronizing memory, as the lines connecting the shift register sections 3 and the I/O circuits 4 (i.e., the lines in which the signals eRead, oRead, eWrite, and oWrite flow) can be made shorter, the operation margin of a high-speed operation can be sufficiently obtained.

Second Embodiment

Next, a high-frequency clock signal synchronizing memory according to a second embodiment of the present invention will be explained.

Figure 25:
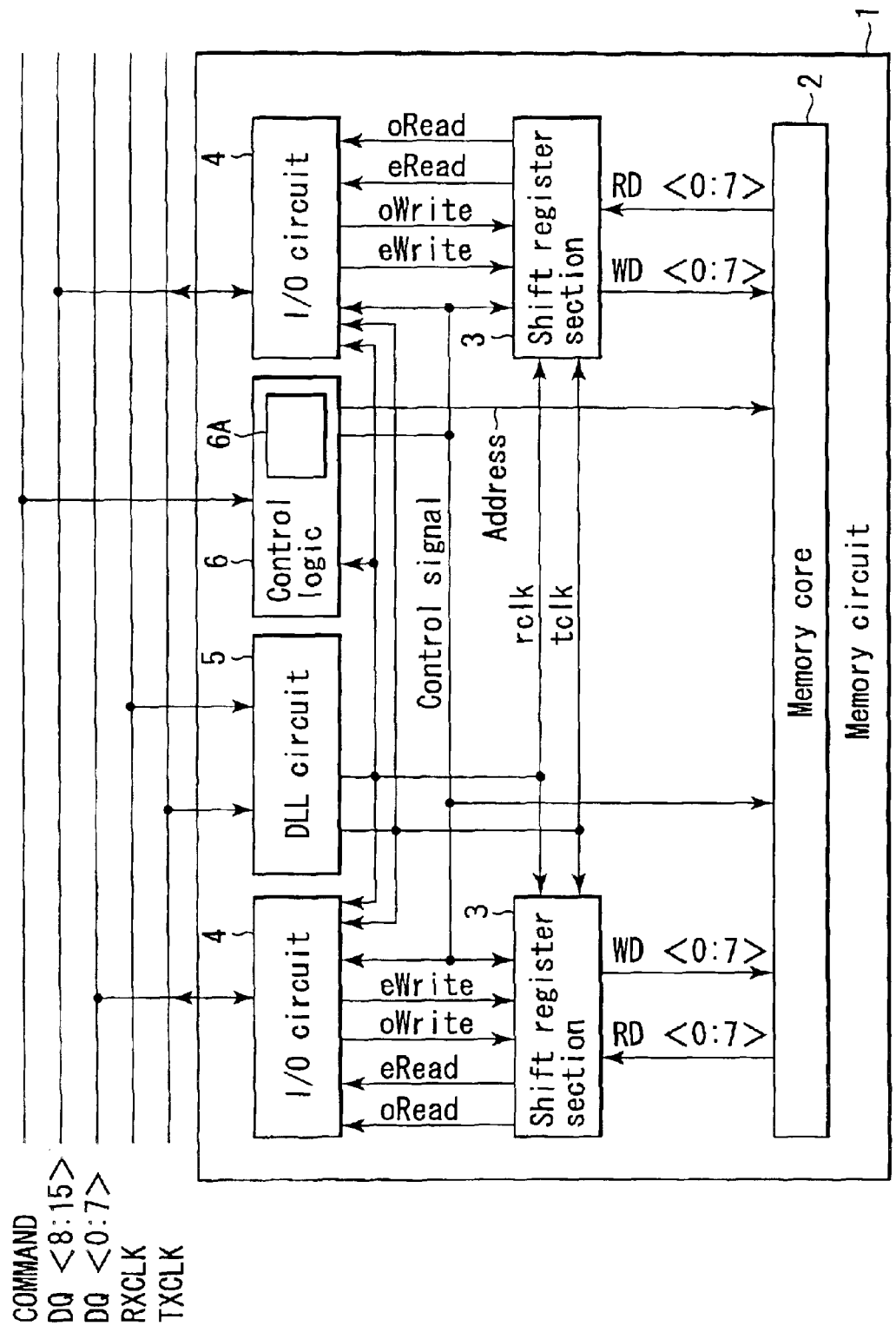
FIG. 25 is a block diagram showing a circuit configuration of a high-frequency clock signal synchronizing memory according to a second embodiment of the present invention.

FIG. 25 is a block diagram showing a circuit configuration of the high-frequency clock signal synchronizing memory according to the second embodiment.

The second embodiment comprises a signal generating circuit 6A in the control logic 6 as shown in FIG. 25. The signal generating circuit 6A generates the signals eROPN<0:3>, oROPN<0:3>, eWOPN<0:3>, and oWOPN<0:3> that are input to the above-described shift registers, and can freely change the timing at which the signals eROPN<0:3>, oROPN<0:3>, eWOPN<0:3>, and oWOPN<0:3> become "H".

If the sequence in which the signals eROPN<0:3>, oROPN<0:3>, eWOPN<0:3>, and oWOPN<0:3> become "H" can be freely changed by the signal generating circuit 6A, the sequence of the data to be written in the write operation and the sequence of the data to be read in the read operation can be arbitrarily changed.

The other configuration is the same as that of the first embodiment and only constituent elements different from the first embodiment will be explained below.

Figure 26A:
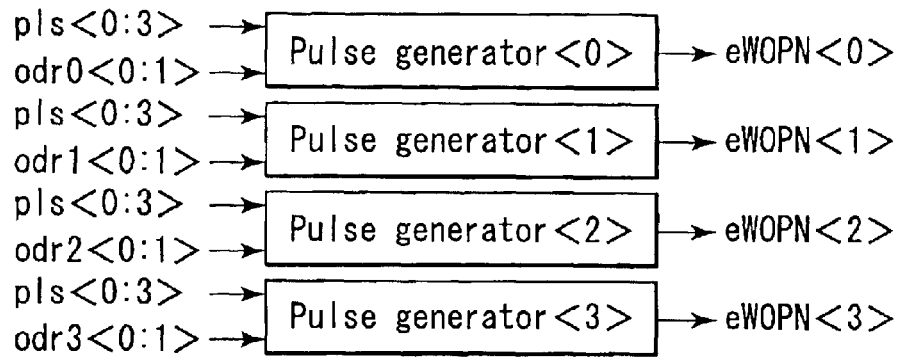
FIGS. 26A, 26B, and 26C are block diagrams and a circuit diagram showing a configuration of a signal generating circuit provided in the high-frequency clock signal synchronizing memory according to the second embodiment of the present invention.
Figure 26B:
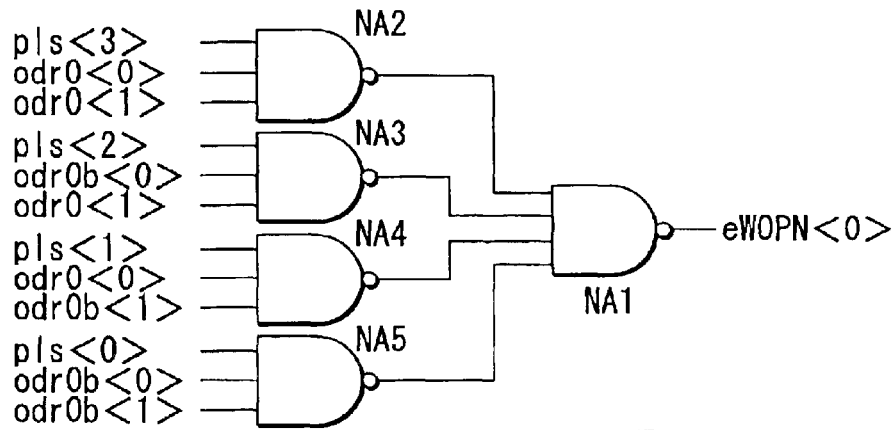
Figure 26C:
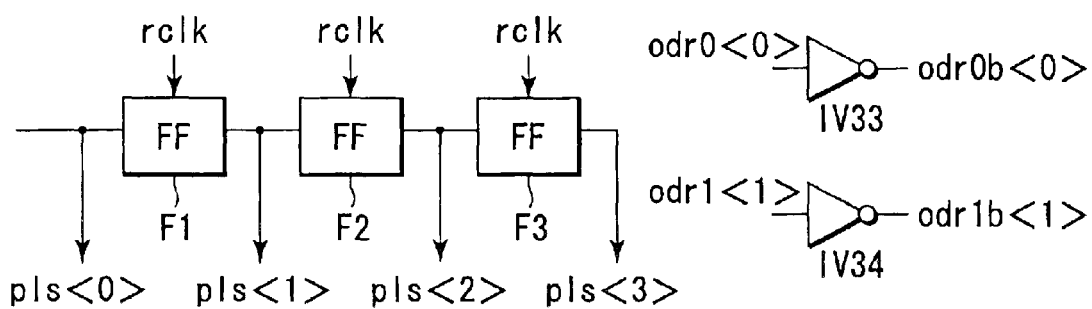

FIGS. 26A, 26B, and 26C are block diagrams and a circuit diagram showing a configuration of the signal generating circuit 6A provided in the high-frequency clock signal synchronizing memory according to the second embodiment. A circuit generating the signals eWOPN<0:3> is exemplified here. Signal generating circuits generating the signals oWOPN<0:3>, eROPN<0:3>, and oROPN<0:3> can also be formed with the same configuration.

FIG. 26A shows a block diagram of the signal generating circuit generating the signals eWOPN<0:3>. Signals pls<0:3> and odr0<0:1> are input to a pulse generator <0> and the signal eWOPN<0> is output therefrom. Similarly, signals pls<0:3> and odr1<0:1>, signals pls<0:3> and odr2<0:1>, and signals pls<0:3> and odr3<0:1> are input to a pulse generator <1>, a pulse generator <2>, and a pulse generator <3>, respectively, and the signals eWOPN<1>, eWOPN<2>, and eWOPN<3> are output therefrom.

FIG. 26B shows a circuit diagram of the pulse generator <0>. An output terminal of a NAND circuit NA2 is connected to a first input terminal of a NAND circuit NA1. Similarly, output terminals of NAND circuits NA3, NA4, and NA5 are connected to a second input terminal, a third input terminal and a fourth input terminal of the NAND circuit NA1, respectively. The signal pls<3> is input to a first input terminal of the NAND circuit NA2, the signal odr0<0> is input to a second input terminal thereof, and the odr0<1> is input to a third input terminal thereof. The signal pls<2> is input to a first input terminal of the NAND circuit NA3, the signal odr0b<0> is input to a second input terminal thereof, and the odr0<1> is input to a third input terminal thereof.

The signal pls<1> is input to a first input terminal of the NAND circuit NA4, the signal odr0<0> is input to a second input terminal thereof, and the odr0b<1> is input to a third input terminal thereof. The signal pls<0> is input to a first input terminal of the NAND circuit NA5, the signal odr0b<0> is input to a second input terminal thereof, and the odr0b<1> is input to a third input terminal thereof.

FIG. 26C shows a circuit generating the signals pls<0:3> and a circuit generating the signals odr0b<0:1>.

The circuit generating the signals pls<0:3> is composed of three flip-flops (FF) F1, F2, and F3 connected in series. If a one-clock pulse is input to the flip-flop F1, the signals pls<1>, pls<2>, and pls<3> each delayed by one cycle, are generated by the flip-flops F1 to F3, respectively.

The circuit generating the signals odr0b<0:1> is composed of a NOT circuit IV33 or IV34. If the signal odr0<0> is input to the NOT circuit IV33, the circuit reverses the signal and outputs the signal odr0b<0>. Similarly, if the signal odr0<1> is input to the NOT circuit IV34, the circuit reverses the signal and outputs the signal odr0b<1>.

Next, an example of arbitrarily changing the sequence of the data written in the write operation, and arbitrarily changing the sequence of the data read in the read operation, by the signal generating circuit 6A shown in FIG. 26A to FIG. 26C, will be explained.

Figure 27A:
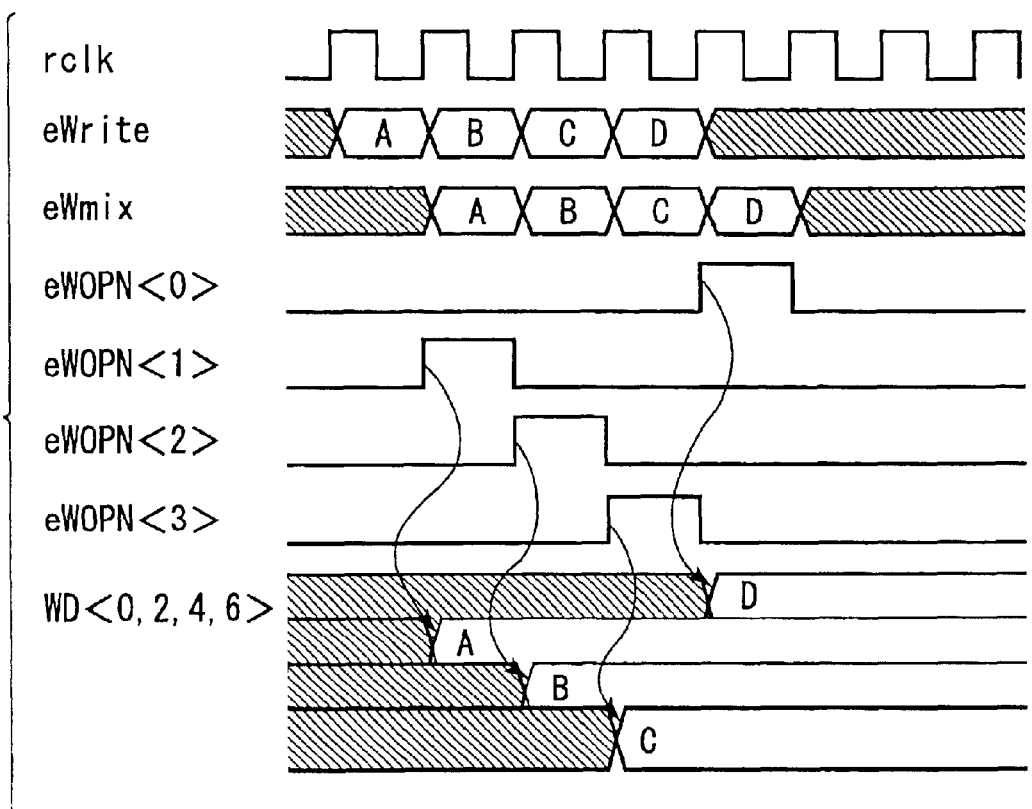
FIG. 27A is a timing waveform chart showing a write operation in the high-frequency clock signal synchronizing memory according to the second embodiment of the present invention.
Figure 27B:
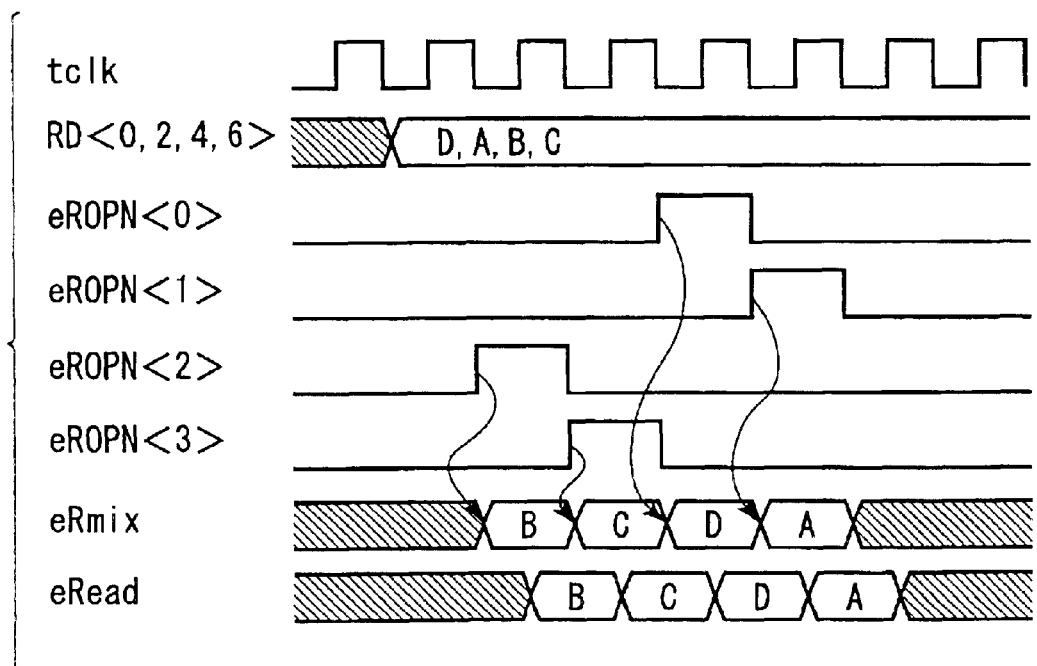
FIG. 27B is a timing waveform chart showing a read operation in the high-frequency clock signal synchronizing memory according to the second embodiment of the present invention.

FIG. 27A and FIG. 27B are waveform charts in a case of changing the sequence of the data written in the write operation, and changing the sequence of the data read in the read operation.

First, in the write operation, if the signals eWOPN<0:3> become "H" in sequence of eWOPN<1>, eWOPN<2>, eWOPN<3>, and eWOPN<0>, the parallel write data WD<0, 2, 4, 6> become data D, A, B, and C, respectively, as shown in FIG. 27A, and then the data are written.

Next, in the read operation, the data D, A, B, and C are read in the parallel read data RD<0, 2, 4, 6> as shown in FIG. 27B. If the signals eROPN<0:3> become "H" in sequence of eROPN<2>, eROPN<3>, eROPN<0>, and eROPN<1>, the serial read data eRead becomes the serial data B, C, D, and A.

In this example, by performing the read operation after the write operation, the data in sequence of A, B, C, and D in the write operation become the data in sequence of B, C, D, and A.

Next, an example of arbitrarily controlling the output timing of the signals eWOPN<0:3> in the signal generating circuit 6A shown in FIGS. 26A to 26C, will be explained.

The signals odr0<0:1>, odr1<0:1>, odr2<0:1> and odr3<0:1> are 2-bit signals controlling the timing of the output ("H" pulse) of the signals eWOPN<0>, eWOPN<1>, eWOPN<2>, and eWOPN<3>, respectively. They are totally 8-bit signals. The timings at which "H" of the signals eWOPN<0:3> rises are arbitrarily controlled by inputting the 8-bit signals with a memory controller or the like provided outside.

The output timings of the signals eWOPN<0:3> in the write operation shown in FIG. 27A are controlled by signals odr0<0:1>, odr1<0:1>, odr2<0:1>, and odr3<0:1> shown in FIG. 28A. If the signals odr0<0:1>, odr1<0:1>, odr2<0:1>, and odr3<0:1>, and the signals pls<0:3> are input to the signal generating circuit 6A shown in FIGS. 26A to 26C, the signals eWOPN<0:3> are output from the circuit at timings shown in FIG. 28B.

In addition, the output timings of the signals eROPN<0:3> in the read operation shown in FIG. 27B are controlled by signals odr0<0:1>, odr1<0:1>, odr2<0:1>, and odr3<0:1> shown in FIG. 29A. In the signal generating circuit 6A shown in FIGS. 26A to 26C, the output signals eWOPN<0:3> are changed to signals eROPN<0:3> and the clock signal rclk is changed to a clock signal tclk. If the signals odr0<0:1>, odr1<0:1>, odr2<0:1>, and odr3<0:1> shown in FIG. 29A, and the signals pls<0:3> are input to such a signal generating circuit, the signals eROPN<0:3> are output therefrom at timings shown in FIG. 29B.

Figure 30:
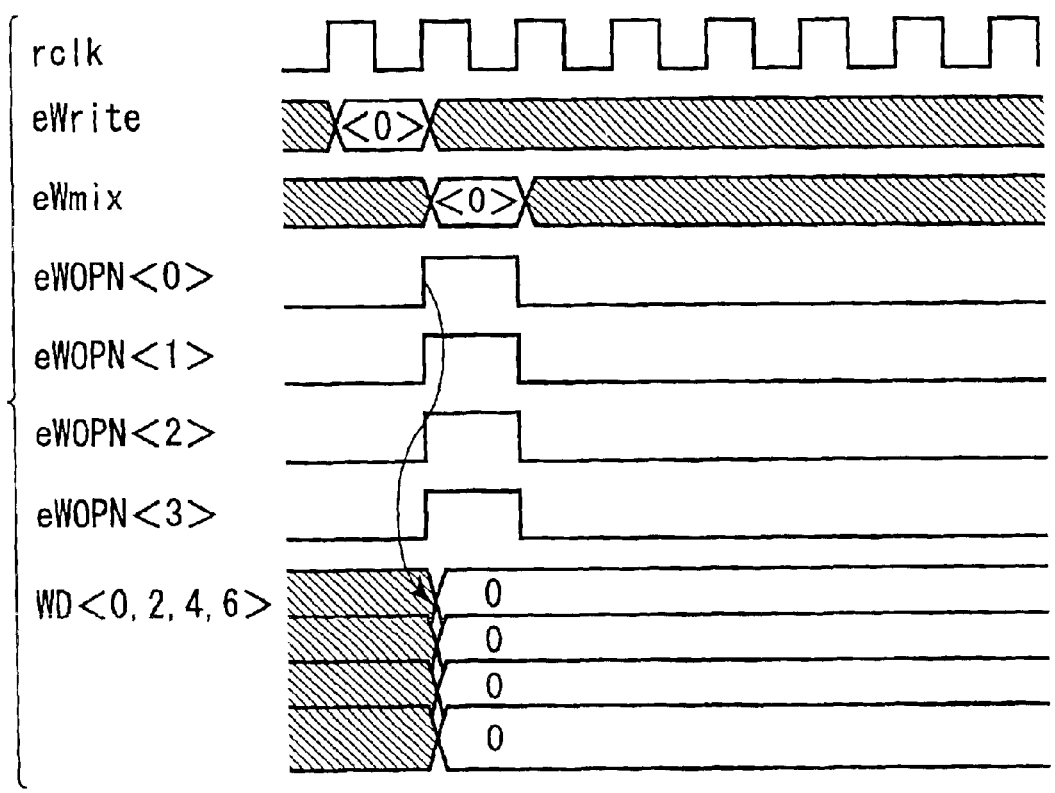
FIG. 30 is a timing waveform chart showing a write operation that all of control clock signals simultaneously become "H", in the high-frequency clock signal synchronizing memory according to the second embodiment of the present invention.
Figures 31A, 31B:
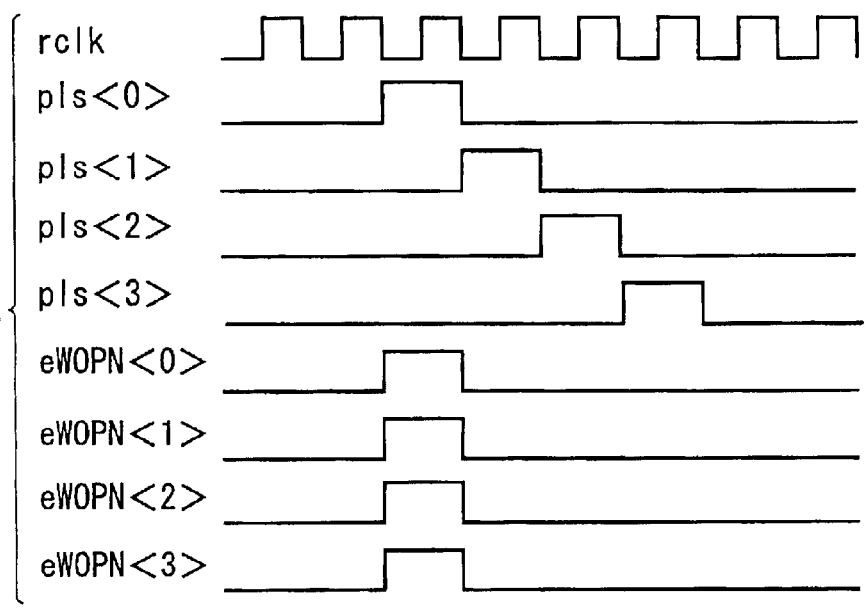
FIGS. 31A and 31B are a table and a timing waveform chart showing an example of generating a control clock signal of the write operation shown in FIG. 30 by the signal generating circuit.

Furthermore, the signals eWOPN<0:3> can be generated so as to become "H" simultaneously, in the write operation. FIG. 30 shows a timing chart in the write operation of this case. If signals odr0<0:1>, odr1<0:1>, odr2<0:1>, and odr3<0:1> shown in FIG. 31A, and the signals pls<0:3> are input to the signal generating circuit 6A shown in FIGS. 26A to 26C, all of the signals eWOPN<0:3> become "H" at the same timing as shown in FIG. 31B.

As described above, if all of the signals eWOPN<0:3> are controlled to become "H" simultaneously, the serial write data eWrite can be entirely converted into the parallel write data WD<0, 2, 4, 6>, by the 1-clock pulse operation. Thus, the time required for the operation test can be reduced in the operation test and the like after manufacturing.

Figures 32A, 32B:
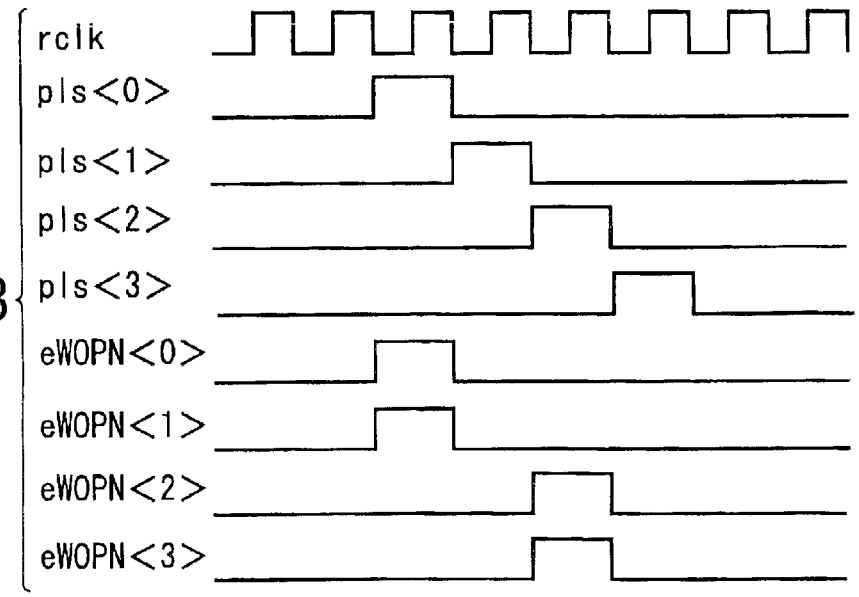
FIGS. 32A and 32B are a table and a timing waveform chart showing another example of generating a control clock signal of the write operation by the signal generating circuit.

Another example of the output timings of the signals eWOPN<0:3> will be explained below. If signals odr0<0:1>, odr1<0:1>, odr2<0:1>, and odr3<0:1> shown in FIG. 32A, and the signals pls<0:3> are input to the signal generating circuit 6A, the signals eWOPN<0:3> can be output at timings as shown in FIG. 32B.

The signal generating circuit 6A in this embodiment sets which of the plural memory cells should store the value of each bit, of plural bits of the serial data, by controlling the timing of the rise or fall of the signals eWOPN<0:3>.

The signal generating circuit 6A also sets which number of value of the serial data should be the value of each bit, of plural bits of the parallel data read from plural memory cells, by controlling the timing of the rise or fall of the signals eROPN<0:3>.

As described above, the sequence of the written data in the read operation and the sequence of the read data in the read operation can be arbitrarily changed in the second embodiment. Thus, the sequence of the data written in the read operation and the sequence of the data read in the read operation can be changed. A simple operation such as change of the sequence of the data can be performed by performing the write operation and the read operation with this function.

Moreover, by making all of the control clock signals become "H" simultaneously in converting the serial write data into the parallel write data, the serial write data can be converted into the parallel write data simultaneously during a period of one cycle of the clock signal. For this reason, when a test of the write operation is performed, the time required for the test can be reduced.

Third Embodiment

Next, a high-frequency clock signal synchronizing memory according to a third embodiment of the present invention will be explained.

In the third embodiment, the signals eROPN<0:3> and oROPN<0:3> and the signals eWOPN<0:3> and oWOPN<0:3> used in the shift registers for even numbers and odd numbers are common and are used as signals ROPN<0:3> and signals WOPN<0:3>.

The other configuration is the same as that of the first embodiment and only constituent elements different from the first embodiment will be explained below.

Figure 33A:
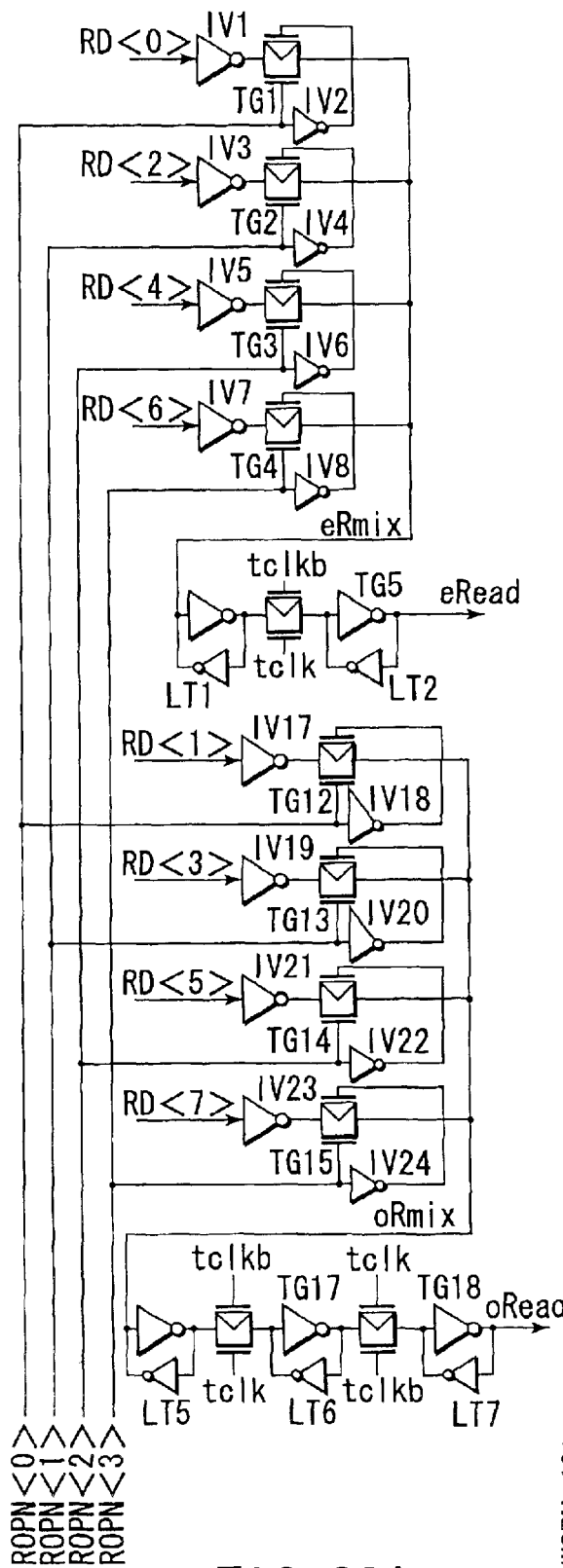
FIG. 33A is a circuit diagram showing a configuration of a read register provided in a shift register section of a high-frequency clock signal synchronizing memory according to a third embodiment of the present invention.
Figure 33B:
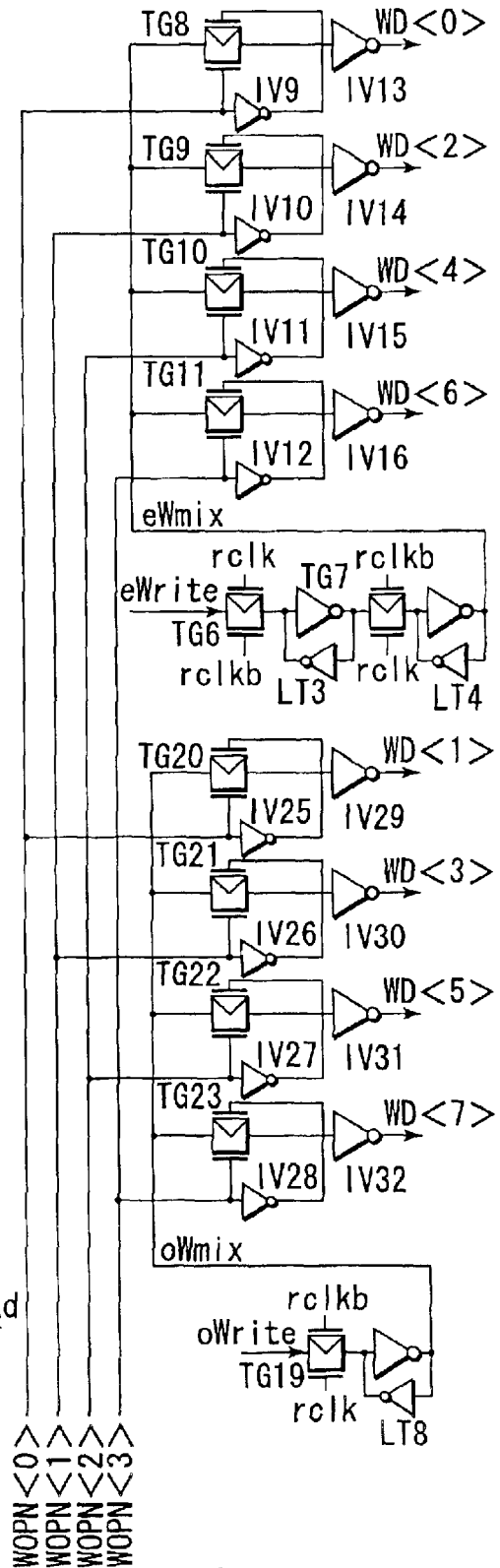
FIG. 33B is a circuit diagram showing a configuration of a write register provided in the shift register section of the high-frequency clock signal synchronizing memory according to the third embodiment of the present invention.

FIG. 33A and FIG. 33B are circuit diagrams showing configurations of read registers and write registers provided in the shift register sections of the high-frequency clock signal synchronizing memory according to the third embodiment of the present invention.

In the read register, as shown in FIG. 33A, the signals eROPN<0:3> and oROPN<0:3> used in the read registers for even numbers and odd numbers are common and are used as signals ROPN<0:3>.

In the write register, as shown in FIG. 33B, the signals eWOPN<0:3> and oWOPN<0:3> used in the write registers for even numbers and odd numbers are common and are used as signals WOPN<0:3>.

The example of inputting the common signals ROPN<0:3> and WOPN<0:3> directly to the read register and the write register, respectively, has been explained. However, the signals ROPN<0:3> and WOPN<0:3> may be input to the read register or the write register after decoded with a predetermined signal, for example, a read command signal or a write command signal.

In this configuration, only one signal ROPN<0> is used instead of the two signals eROPN<0> and oROPN<0> that have been required in the first embodiment. Similarly, a signal ROPN<1>, a signal ROPN<2>, and a signal ROPN<3> are used instead of the signals eROPN<1> and oROPN<1>, the signals eROPN<2> and oROPN<2>, and the signals eROPN<3> and oROPN<3>, respectively.

In addition, only one signal WOPN<0> is used instead of the two signals eWOPN<0> and oWOPN<0> that have been required in the first embodiment. Similarly, a signal WOPN<1>, a signal WOPN<2>, and a signal WOPN<3> are used instead of the signals eWOPN<1> and oWOPN<1>, the signals eWOPN<2> and oWOPN<2>, and the signals eWOPN<3> and oWOPN<3>, respectively.

As a result, the number of the lines of wiring which are needed in the semiconductor memory device can be reduced and the semiconductor memory device can be shrunk.

Fourth Embodiment

Next, a high-frequency clock signal synchronizing memory according to a fourth embodiment of the present invention will be explained.

In the fourth embodiment, the ROPN<0:3> and the WOPN<0:3> that are used in the read register and the write register, respectively, in the shift register of the third embodiment, are common and are used as a signal RWOPN<0:3>.

The other configuration is the same as that of the first embodiment and only constituent elements different from the first embodiment will be explained below.

Figure 34:
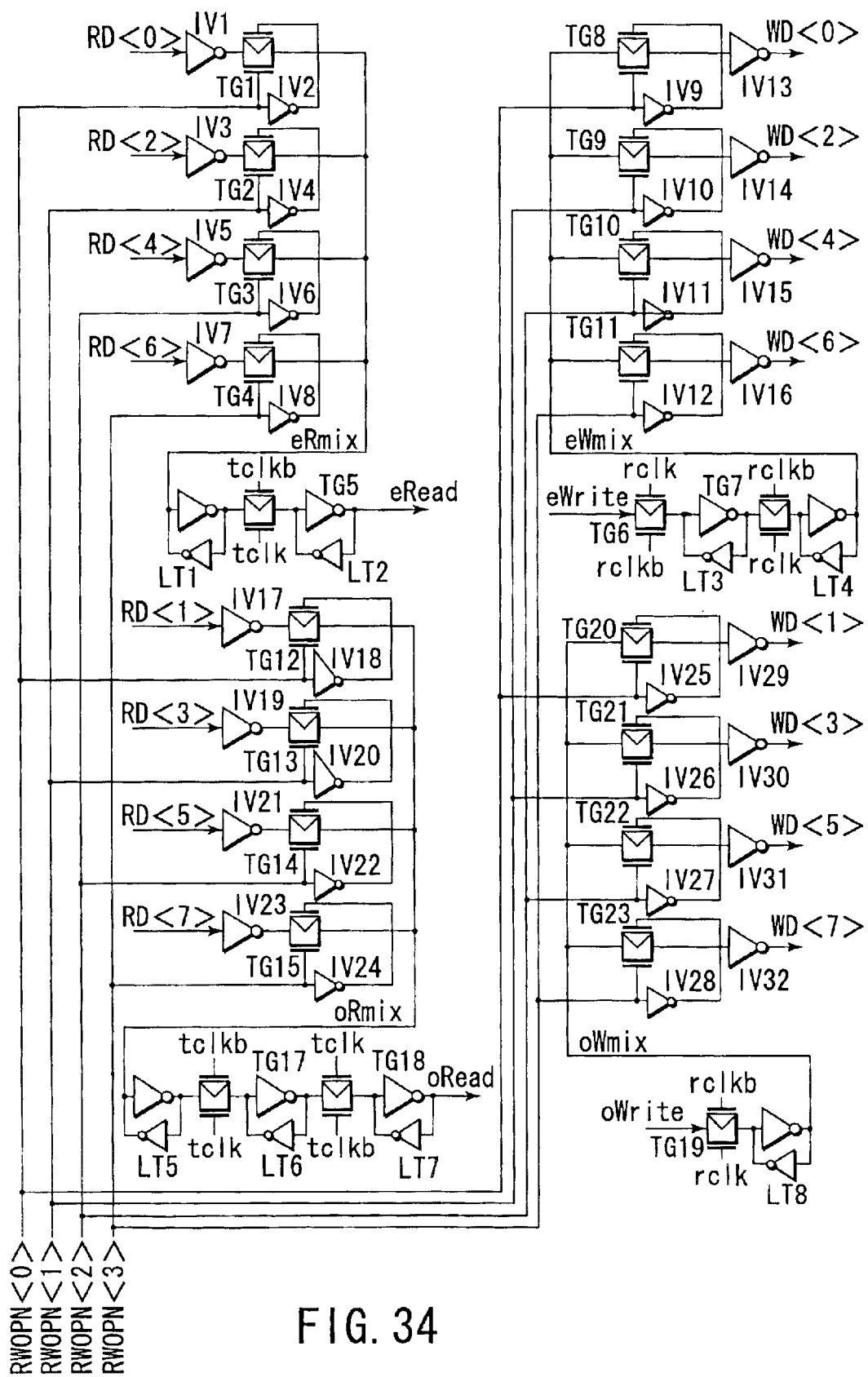
FIG. 34 is a circuit diagram showing configurations of a read register and a write register provided in a shift register section of a high-frequency clock signal synchronizing memory according to a fourth embodiment of the present invention.

FIG. 34 is a circuit diagram showing configurations of a read register and a write register provided in a shift register section of the high-frequency clock signal synchronizing memory according to the fourth embodiment of the present invention.

An example of inputting common signals RWOPN<0:3> directly to the read register and the write register is explained here, but the signals RWOPN<0:3> may be input to the read register and the write register after decoded with a predetermined signal, for example, a read command signal or a write command signal.

In this configuration, only one signal RWOPN<0> is used instead of the two signals ROPN<0> and WOPN<0> that have been required in the third embodiment. Similarly, a signal RWOPN<1>, a signal RWOPN<2>, and a signal RWOPN<3> are used instead of the signals ROPN<1> and WOPN<1>, the signals ROPN<2> and WOPN<2>, and the signals ROPN<3> and WOPN<3>, respectively.

As a result, the number of the lines of wiring which are needed in the semiconductor memory device can be reduced more than the third embodiment and the semiconductor memory device can be shrunk.

According to the embodiments, as described above, the present invention can provide a semiconductor memory device comprising the read register and the write register having functions of changing the sequence of data and the like by giving flexibility to the timing of the signals which control the conversion operation of the read register and the write register.

In addition, the present invention can provide a semiconductor memory device comprising the read register capable of converting the parallel data into the serial data and the write register capable of converting the serial data into the parallel data, with low power consumption, without increasing the chip area, while maintaining the margin of the high-speed operation.

The above described embodiments cannot only be accomplished independently, but can also be arbitrarily combined for accomplishment. Furthermore, the embodiments include various aspects of inventions. By arbitrarily combining a plurality of constituent elements disclosed in the embodiments, various aspects of inventions can also be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a memory cell array including plural memory cells;
an input/output circuit inputting plural bits of serial data from outside and outputting the plural bits of serial data to outside;
a register section comprising a first register and a second register, the first register receiving the plural bits of serial data from the input/output circuit and converting the plural bits of serial data into parallel data, the second register receiving plural bits of parallel data from the plural memory cells and converting the plural bits of parallel data into serial data; and
a signal generating circuit generating plural first control signals and plural second control signals, the plural first control signals supplying a conversion timing for each bit when the plural bits of serial data are converted into the parallel data, the plural second control signals supplying a conversion timing for each bit when the plural bits of parallel data are converted into the serial data, the signal generating circuit controlling a timing of one of rise and fall of the plural first control signals and sets which of the plural memory cells should store a value for each bit, of the plural bits of serial data, and controlling a timing of one of rise and fall of the plural second control signals and sets which number of value of the serial data should be the value for each bit, of the plural bits of parallel data read from the plural memory cells.

2. The semiconductor memory device according to claim 1, wherein the first register is composed of a first write register receiving even numbers of data, of the plural bits of serial data, and converting the even numbers of data into parallel data, and a second write register receiving odd numbers of data, of the plural bits of serial data, and converting the odd numbers of data into parallel data; and the second register is composed of a first read register receiving even numbers of data, of the plural bits of parallel data, and converting the even numbers of data into serial data, and a second read register receiving odd numbers of data, of the plural bits of parallel data, and converting the odd numbers of data into serial data.

3. The semiconductor memory device according to claim 2, wherein the first write register comprises plural transfer gates, even numbers of data, of the plural bits of serial data, are input to an end of a current path of each of the plural transfer gates, the first control signals are input to gates of the plural transfer gates, respectively; and the second write register comprises plural transfer gates, odd numbers of data, of the plural bits of serial data, are input to an end of a current path of each of the plural transfer gates, the first control signals are input to gates of the plural transfer gates, respectively.

4. The semiconductor memory device according to claim 2, wherein the first read register comprises plural transfer gates, even numbers of data, of the plural bits of parallel data, are input to an end of a current path of each of the plural transfer gates, respectively, the second control signals are input to gates of the plural transfer gates, respectively; and the second read register comprises plural transfer gates, odd numbers of data, of the plural bits of parallel data, are input to an end of a current path of each of the plural transfer gates, respectively, the second control signals are input to gates of the plural transfer gates, respectively.

5. The semiconductor memory device according to claim 3, wherein the first read register comprises plural transfer gates, even numbers of data, of the plural bits of parallel data, are input to an end of a current path of each of the plural transfer gates, respectively, the second control signals are input to gates of the plural transfer gates, respectively; and the second read register comprises plural transfer gates, odd numbers of data, of the plural bits of parallel data, are input to an end of a current path of each of the plural transfer gates, respectively, the second control signals are input to gates of the plural transfer gates, respectively.

6. The semiconductor memory device according to claim 3, wherein the first control signals that are input to the first write register are common to the first control signals that are input to the second write register.

7. The semiconductor memory device according to claim 4, wherein the second control signals that are input to the first read register are common to the second control signals that are input to the second read register.

8. The semiconductor memory device according to claim 1, wherein the first control signals and the second control signals that are generated by the signal generating circuit are common to each other.

9. The semiconductor memory device according to claim 5, wherein the first control signals that are input to the first write register and the second write register are common to the second control signals that are input to the first read register and the second read register.

10. The semiconductor memory device according to claim 1, wherein each of the plural first control signals that are output from the signal generating circuit has any one of a different leading edges and a different trailing edges.

11. The semiconductor memory device according to claim 1, wherein at least two of the plural first control signals that are output from the signal generating circuit have any one of the same rise edge and the same fall edge.

12. The semiconductor memory device according to claim 6, wherein the common signals are input to the first write register and the second write register after decoded with a predetermined signal.

13. The semiconductor memory device according to claim 7, wherein the common signals are input to the first read register and the second read register after decoded with a predetermined signal.

14. The semiconductor memory device according to claim 8, wherein the common signals are input to the first register and the second register after decoded with a predetermined signal.

15. The semiconductor memory device according to claim 9, wherein the common signals are input to the first write register, the second write register, the first read register, and the second read register after decoded with a predetermined signal.

* * * * *